US012658878B2

(12) United States Patent
Hiramatsu et al.

(10) Patent No.: US 12,658,878 B2
(45) Date of Patent: Jun. 16, 2026

(54) ACOUSTIC WAVE DEVICE WITH MULTILAYER PIEZOELECTRIC SUBSTRATE FOR REDUCED SPURIOUS SIGNALS

(71) Applicant: Skyworks Solutions, Inc., Irvine, CA (US)

(72) Inventors: Yuya Hiramatsu, Neyagawa (JP); Takuya Ushiyama, Moriguchi (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 874 days.

(21) Appl. No.: 17/938,261

(22) Filed: Oct. 5, 2022

(65) Prior Publication Data

US 2023/0104405 A1 Apr. 6, 2023

Related U.S. Application Data

(60) Provisional application No. 63/252,984, filed on Oct. 6, 2021.

(51) Int. Cl.
| | |
|---|---|
| *H03H 9/02* | (2006.01) |
| *H03H 9/10* | (2006.01) |
| *H03H 9/145* | (2006.01) |
| *H03H 9/64* | (2006.01) |

(52) U.S. Cl.
CPC .... *H03H 9/02574* (2013.01); *H03H 9/02559* (2013.01); *H03H 9/1064* (2013.01); *H03H 9/14541* (2013.01); *H03H 9/643* (2013.01)

(58) Field of Classification Search
CPC ........... H03H 9/02574; H03H 9/02559; H03H 9/1064; H03H 9/14541
USPC ...... 310/313 R, 313 A, 313 B, 313 C, 313 D
See application file for complete search history.

(56) References Cited

U.S. PATENT DOCUMENTS

| | | | |
|---|---|---|---|
| 7,902,627 | B2 | 3/2011 | Dong et al. |
| 8,198,951 | B2 | 6/2012 | Dong et al. |
| 10,749,497 | B2 | 8/2020 | Tang et al. |
| 10,873,313 | B2 | 12/2020 | Zou et al. |
| 11,050,406 | B2 | 6/2021 | Maki et al. |
| 11,245,378 | B2 | 2/2022 | Tang et al. |
| 11,522,514 | B2 | 12/2022 | Zou et al. |
| 11,606,078 | B2 | 3/2023 | Tang et al. |
| 11,616,491 | B2 | 3/2023 | Tang et al. |
| 11,705,883 | B2 | 7/2023 | Hiramatsu et al. |
| 11,722,122 | B2 | 8/2023 | Goto et al. |
| 11,750,172 | B2 | 9/2023 | Goto et al. |
| 11,804,822 | B2 | 10/2023 | Fukuhara et al. |
| 11,811,392 | B2 | 11/2023 | Hiramatsu et al. |

(Continued)

*Primary Examiner* — Derek J Rosenau
(74) *Attorney, Agent, or Firm* — VIA LLP

(57) ABSTRACT

An acoustic wave resonator is disclosed. The acoustic wave resonator can include a plurality of interdigital transducer electrodes and a multilayer piezoelectric substrate (MPS) adjacent the plurality of interdigital transducer electrodes. The MPS includes a first substrate layer of a piezoelectric material, and a second substrate layer of silicon that is bonded to the first layer. The silicon has a cut direction and/or acoustic wave propagation direction that is different from those of a silicon substrate. The silicon substrate has a cut direction and a propagation direction property defined by the silicon cut angle of {100} and the propagation direction <110>.

20 Claims, 18 Drawing Sheets

(56) References Cited

U.S. PATENT DOCUMENTS

| | | | |
|---|---|---|---|
| 11,824,515 | B2 | 11/2023 | Tang et al. |
| 11,848,658 | B2 | 12/2023 | Hiramatsu et al. |
| 11,870,421 | B2 | 1/2024 | Hiramatsu et al. |
| 11,962,283 | B2 | 4/2024 | Zou et al. |
| 12,040,784 | B2 | 7/2024 | Tang et al. |
| 12,047,053 | B2 | 7/2024 | Maki et al. |
| 2019/0379347 | A1 | 12/2019 | Goto et al. |
| 2022/0158610 | A1 | 5/2022 | Goto et al. |
| 2022/0158612 | A1 | 5/2022 | Goto et al. |
| 2022/0209738 | A1 | 6/2022 | Torazawa et al. |
| 2022/0271730 | A1 | 8/2022 | Abbott et al. |
| 2022/0271733 | A1 | 8/2022 | Abbott et al. |
| 2022/0271734 | A1 | 8/2022 | Abbott et al. |
| 2022/0328980 | A1 | 10/2022 | Dicarlo et al. |
| 2022/0329227 | A1 | 10/2022 | Goto et al. |
| 2022/0385270 | A1* | 12/2022 | Oh .................... H03H 9/14538 |
| 2022/0399867 | A1 | 12/2022 | Goto et al. |
| 2022/0399871 | A1 | 12/2022 | Goto et al. |
| 2023/0013597 | A1 | 1/2023 | Goto et al. |
| 2023/0026465 | A1 | 1/2023 | Huang et al. |
| 2023/0031568 | A1 | 2/2023 | Tang et al. |
| 2023/0105726 | A1 | 4/2023 | Tang et al. |
| 2023/0107376 | A1 | 4/2023 | Goto et al. |
| 2023/0109106 | A1 | 4/2023 | Hiramatsu et al. |
| 2023/0112677 | A1 | 4/2023 | Tang et al. |
| 2023/0208385 | A1 | 6/2023 | Hiramatsu et al. |
| 2023/0208396 | A1 | 6/2023 | Hiramatsu et al. |
| 2023/0208398 | A1 | 6/2023 | Goto et al. |
| 2023/0208399 | A1 | 6/2023 | Goto et al. |
| 2023/0231529 | A1 | 7/2023 | Hiramatsu et al. |
| 2023/0275565 | A1 | 8/2023 | Tang et al. |
| 2023/0283261 | A1 | 9/2023 | Huang et al. |
| 2023/0327641 | A1* | 10/2023 | Daimon ............. H03H 9/02566 |
| 2023/0336152 | A1 | 10/2023 | Goto et al. |
| 2023/0336153 | A1 | 10/2023 | Goto et al. |
| 2023/0336159 | A1 | 10/2023 | Hiramatsu et al. |
| 2024/0186978 | A1 | 6/2024 | Hiramatsu et al. |
| 2024/0305265 | A1 | 9/2024 | Ushiyama et al. |

* cited by examiner

REFLECTOR          IDT ACTIVE REGION          REFLECTOR

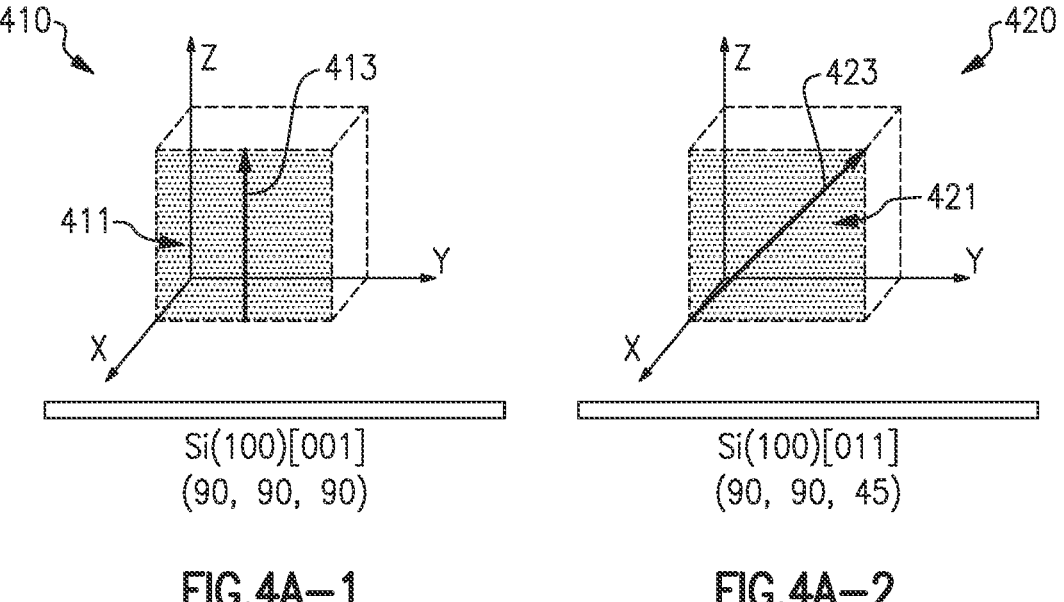
Si(100)[001]
(90, 90, 90)
FIG.4A—1
Si(100)[011]
(90, 90, 45)
FIG.4A—2

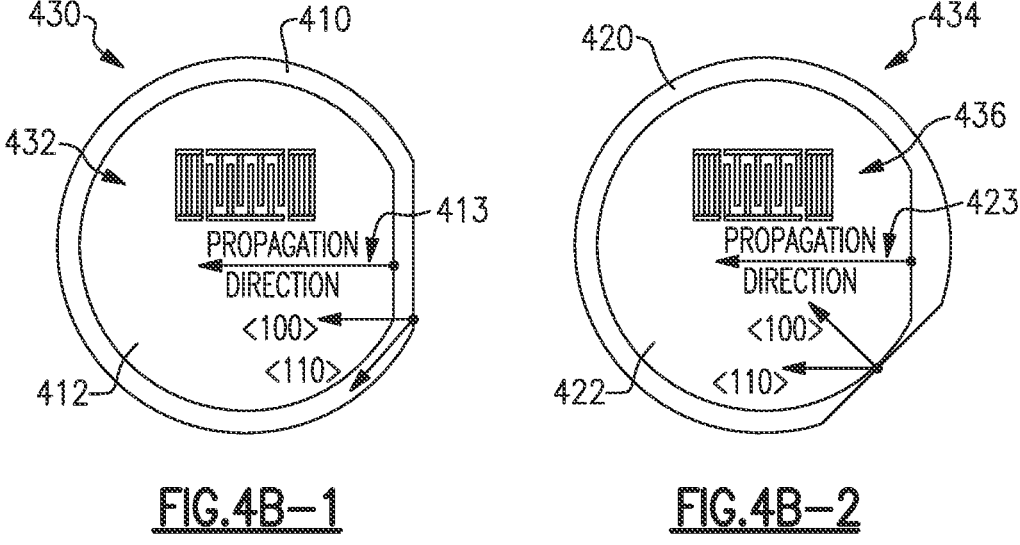
FIG.4B—1                    FIG.4B—2

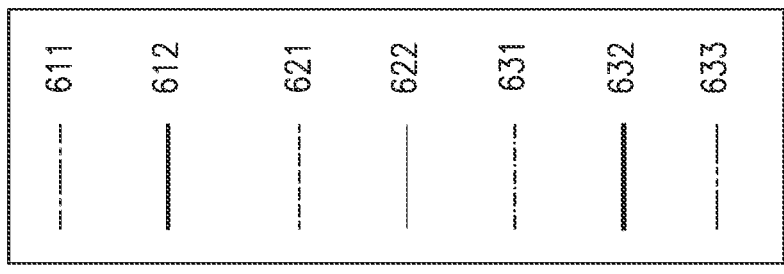
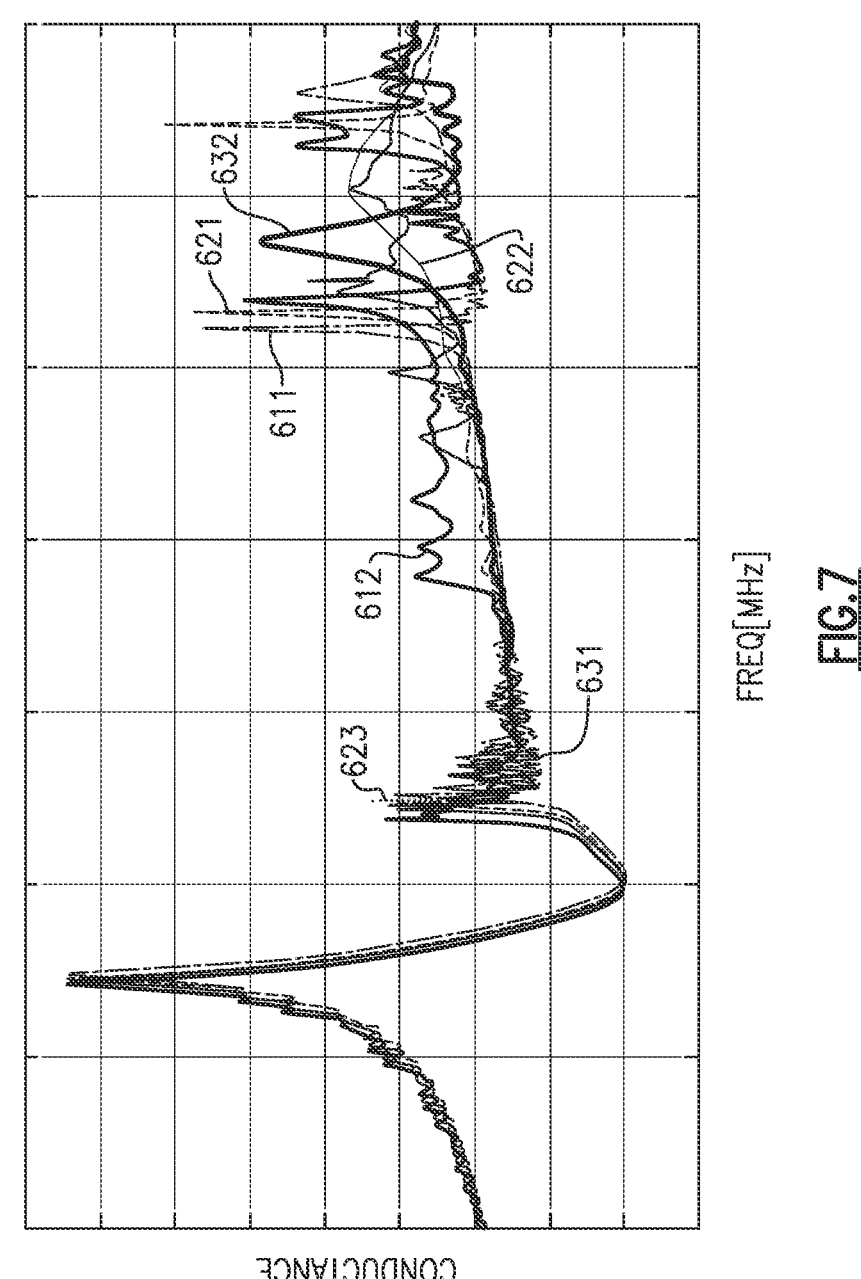
FREQ[MHZ]
FIG.7

612

Si (100)
(90, 90, 45)

611

Si (100)
(90, 90, 90)

621

Si (110)
(45, 90, 90)

632

Si (111)
(45, 54.74, 60)

PROPAGATION
DIRECTION
0° 5° 10° 15° 20° 25° 30° 35° 40° 45°
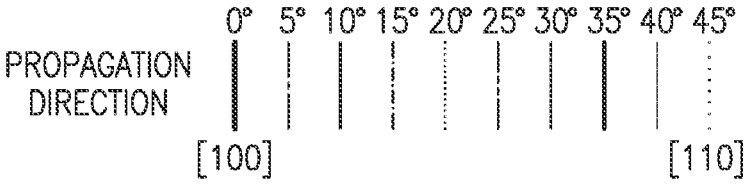
[100] [110]
FIG.10A
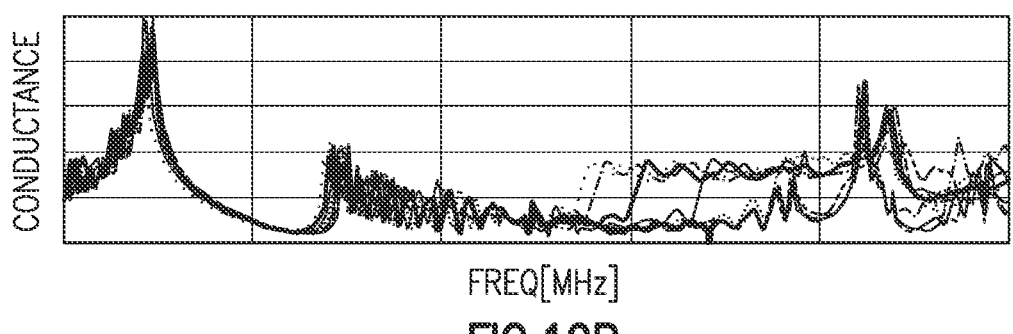
FREQ[MHz]
FIG.10B
GAMMA S11
FREQ[MHz]
FIG.10C

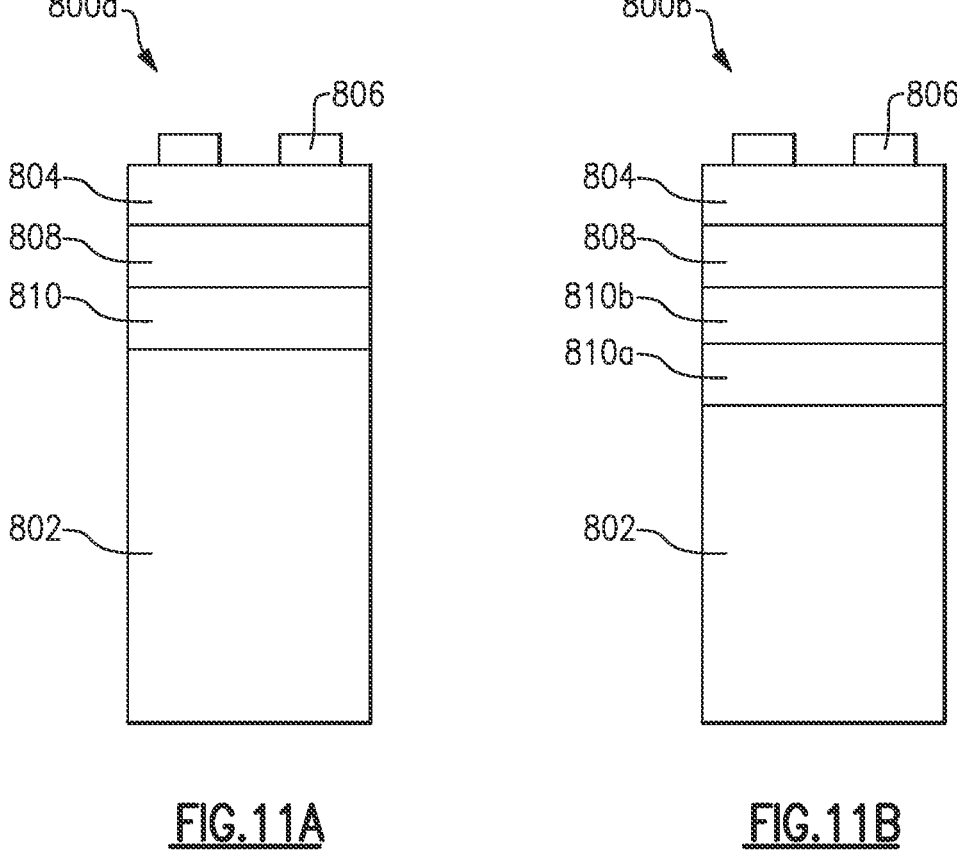
FIG.11A                              FIG.11B

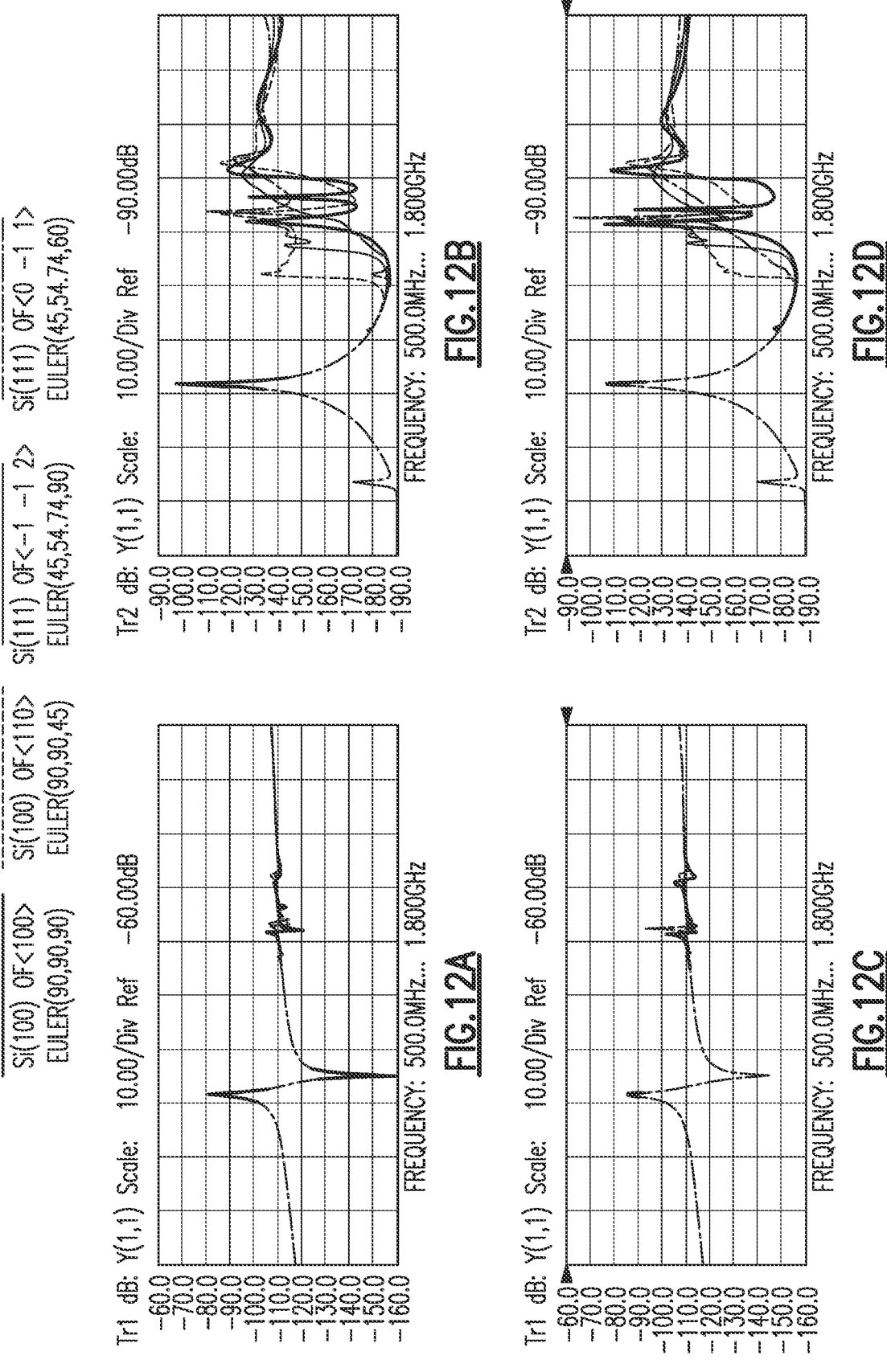

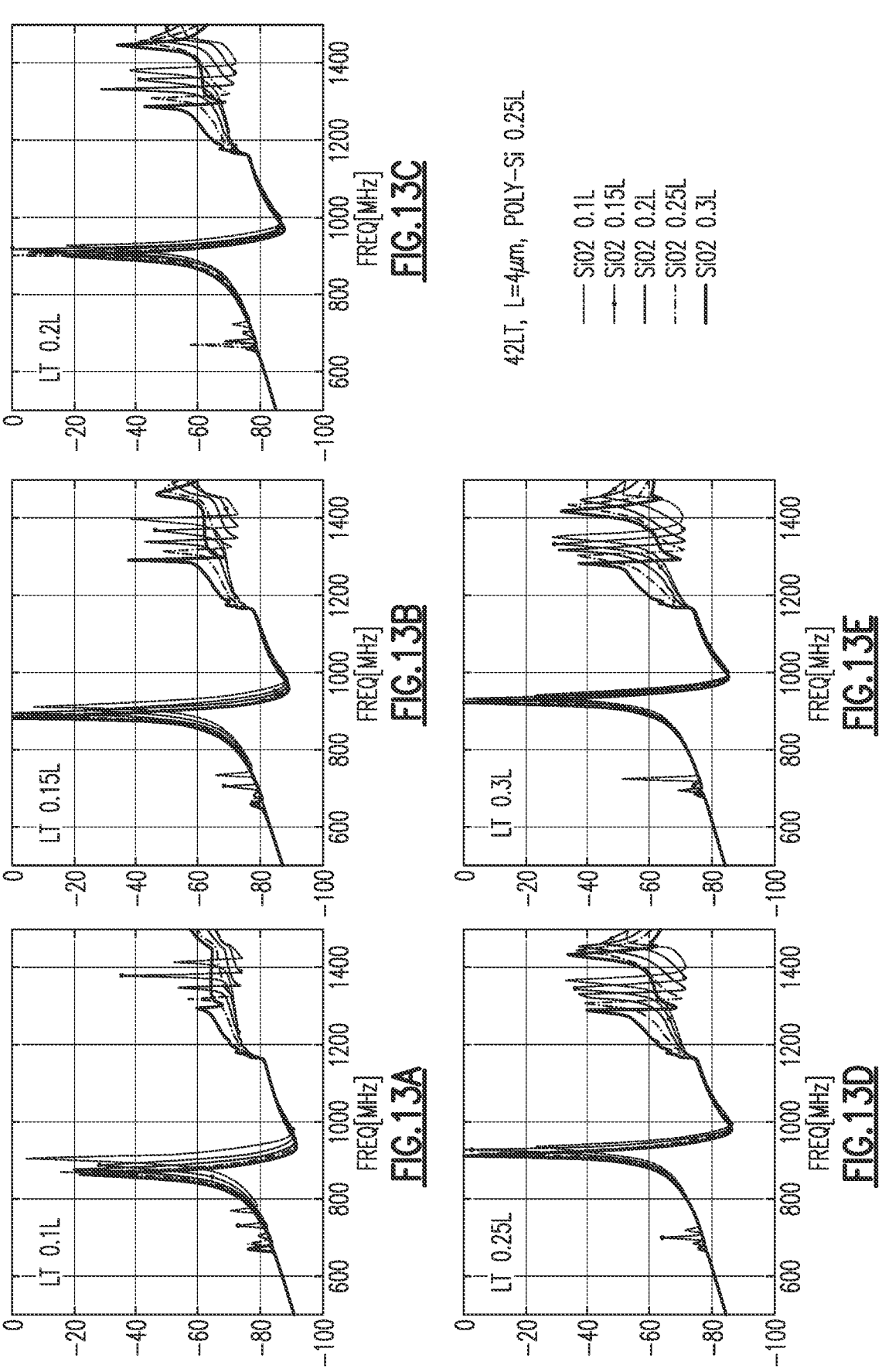

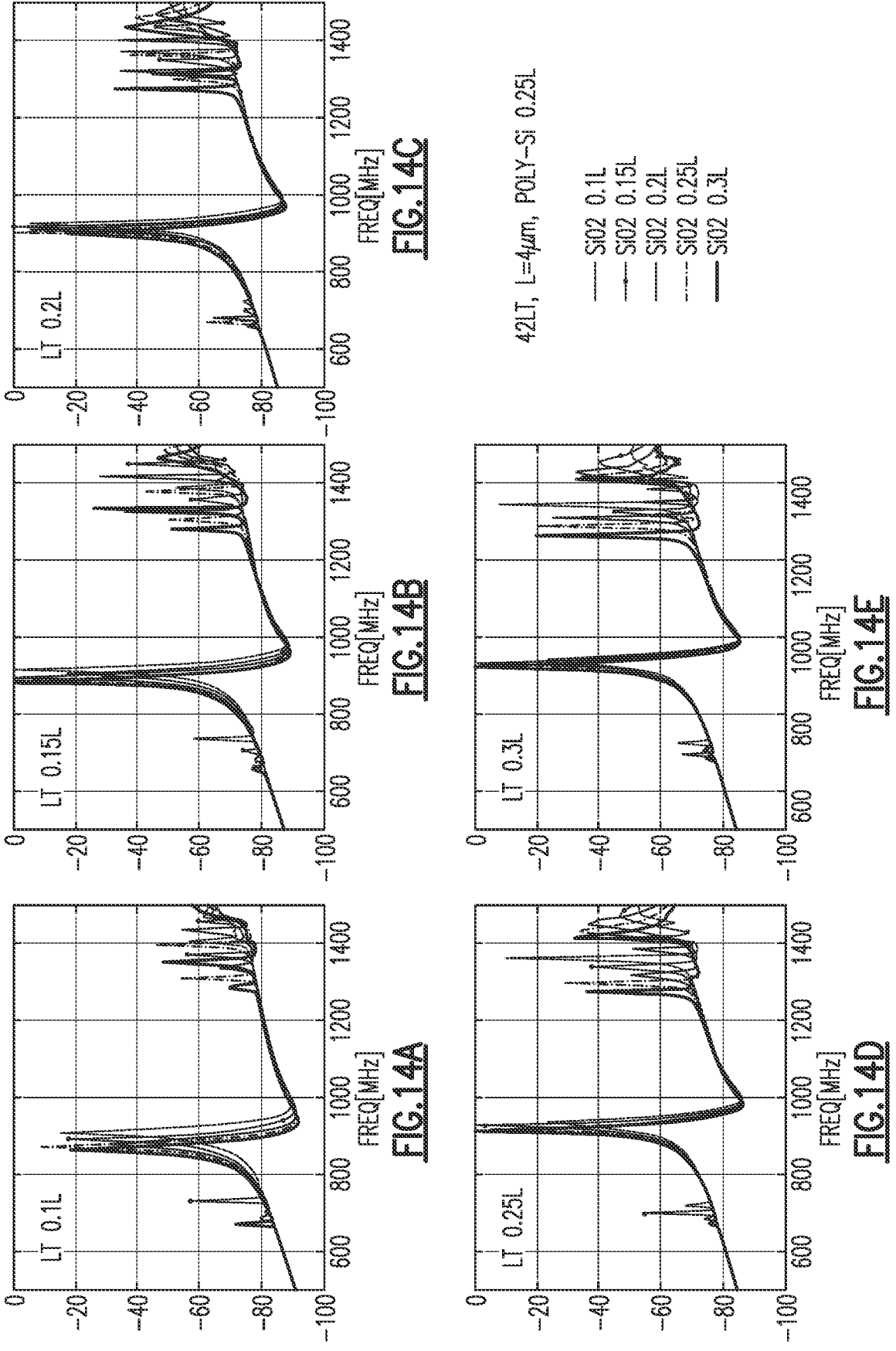

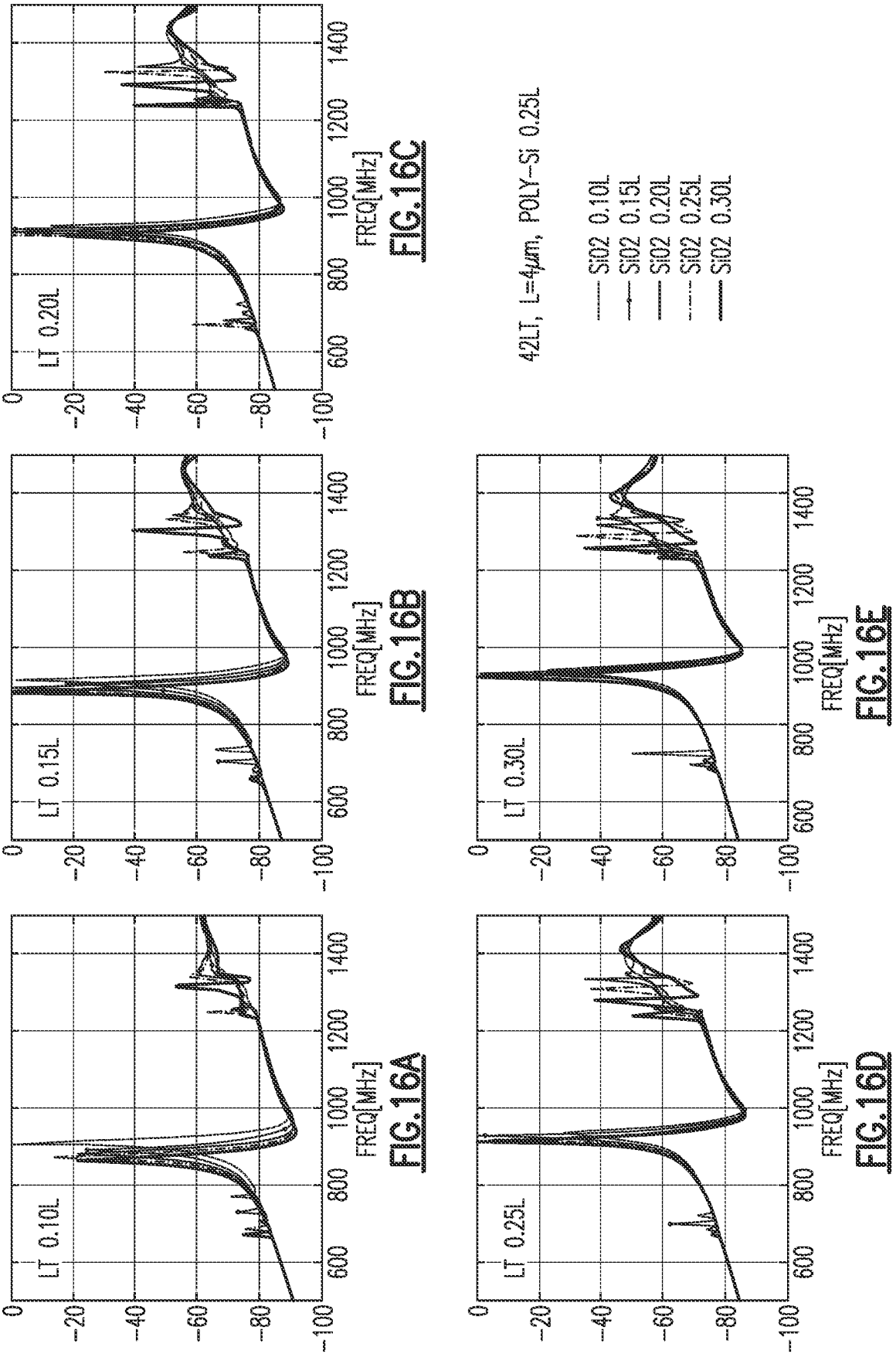

| | THICKNESS[L] | | VELOCITY[m/s]L *freq | | | |
|---|---|---|---|---|---|---|
| | LT | SiO2 | Si(100)<100> | Si(111)<0−11> | Si(100)<110> | Si(111)<−1−12> |
| 1 | 0.10 | 0.10 | 5620 | 5800 | 4680 | 5040 |
| 2 | 0.10 | 0.15 | 5480 | 5700 | 4680 | 5020 |
| 3 | 0.10 | 0.20 | 5360 | 5600 | 4680 | 5020 |
| 4 | 0.10 | 0.25 | 5240 | 5480 | 4680 | 5020 |
| 5 | 0.10 | 0.30 | 5160 | 5320 | 4680 | 4960 |
| 6 | 0.15 | 0.10 | 5560 | 5720 | 4680 | 5040 |
| 7 | 0.15 | 0.15 | 5440 | 5620 | 4680 | 5020 |
| 8 | 0.15 | 0.20 | 5320 | 5540 | 4680 | 5020 |
| 9 | 0.15 | 0.25 | 5220 | 5420 | 4680 | 5000 |
| 10 | 0.15 | 0.30 | 5140 | 5260 | 4680 | 4960 |
| 11 | 0.20 | 0.10 | 5500 | 5640 | 4680 | 5040 |
| 12 | 0.20 | 0.15 | 5400 | 5560 | 4680 | 5020 |
| 13 | 0.20 | 0.20 | 5300 | 5460 | 4680 | 5020 |
| 14 | 0.20 | 0.25 | 5200 | 5360 | 4680 | 5000 |
| 15 | 0.20 | 0.30 | 5120 | 5220 | 4680 | 4960 |
| 16 | 0.25 | 0.10 | 5440 | 5540 | 4680 | 5040 |
| 17 | 0.25 | 0.15 | 5360 | 5480 | 4680 | 5020 |
| 18 | 0.25 | 0.20 | 5280 | 5400 | 4680 | 5020 |
| 19 | 0.25 | 0.25 | 5180 | 5280 | 4680 | 5000 |
| 20 | 0.25 | 0.30 | 5100 | 5140 | 4680 | 4960 |
| 21 | 0.30 | 0.10 | 5380 | 5460 | 4680 | 5040 |
| 22 | 0.30 | 0.15 | 5320 | 5380 | 4680 | 5020 |
| 23 | 0.30 | 0.25 | 5240 | 5300 | 4680 | 5020 |
| 24 | 0.30 | 0.30 | 5160 | 5200 | 4680 | 5000 |
| 25 | 0.30 | 0.10 | 5060 | 5060 | 4680 | 4960 |

FIG.17

ACOUSTIC WAVE DEVICE WITH MULTILAYER PIEZOELECTRIC SUBSTRATE FOR REDUCED SPURIOUS SIGNALS

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/252,984, filed Oct. 6, 2021, titled "MULTILAYER PIEZOELECTRIC SUBSTRATE," are hereby incorporated by reference under 37 CFR 1.57 in their entirety.

BACKGROUND

Field

Embodiments of the present disclosure relate to surface acoustic wave (SAW) resonators comprising a multilayer piezoelectric substrate (MPS) for enhanced reflection characteristics of the SAW resonators.

Description of the Related Technology

A surface acoustic wave (SAW) device includes a piezoelectric layer such as lithium tantalate or lithium niobate. Features of the SAW device, such as interdigital transducer (IDT) electrodes and reflector electrodes, as well as other circuitry, for example, conductive traces, may be formed on the piezoelectric layer.

During operation, the SAW device may generate heat and can cause the piezoelectric layer to expand. Materials typically used for a piezoelectric layer of SAW devices generally have low thermal conductivities, for example, about 0.05 W/cm·K for lithium tantalite and about 0.06 W/cm·K for lithium niobate. Therefore, the heat generated during operation of conventional SAW resonators may not be dissipated sufficiently. The expansion of the piezoelectric layer, as well as other features of the device, can cause operating parameters, for example, resonant frequency of the resonator, to change. A silicon substrate can be bonded to the lower surface of the piezoelectric substrate of the SAW resonators opposite the upper surface of the wafer of the piezoelectric material defining a multilayer piezoelectric substrate (MPS) structure. A large amount of high-frequency spuriousness can occur in such MPS SAW device.

SUMMARY

According to one embodiment there is provided, an acoustic wave resonator comprising: a plurality of interdigital transducer electrodes; and a multilayer piezoelectric substrate (MPS) adjacent the plurality of interdigital transducer electrodes, the MPS including: a first substrate layer of a piezoelectric material; and a second substrate layer of silicon bonded to the first layer, the silicon having a cut direction and/or acoustic wave propagation direction which is different from those of a silicon substrate, the silicon substrate having a cut direction and a propagation direction property defined by the silicon cut angle of {100} and the propagation direction <110>.

In one example, the propagation direction of the acoustic waves in the silicon is <100>.

In one example, the propagation direction of acoustic waves in the silicon is in the range of −20° to 20° from the <100> direction.

In one example, the silicon cut angle is at {111} and the propagation direction of acoustic waves is <110>.

In one example, the silicon cut angle is at {111} with a propagation direction of acoustic waves at a range of −0.5° to 0.5° from a <110> direction.

In one example, the silicon has a cut angle of (100) and a propagation direction of [001]±20 degrees, or the silicon has a cut angle of (110), and a propagation direction of [001]±20 degrees, or the silicon has a cut angle of (111) and a propagation direction of [011]±0.5 degrees.

In one example, the plurality of interdigital transducer electrodes define the propagation direction of the generated acoustic waves.

In one example, the first substrate layer of piezoelectric material is lithium tantalate or lithium niobate.

In one example, the first substrate layer of piezoelectric material is 42° Y-X lithium tantalate.

In one example, the first substrate layer of piezoelectric material has a cut angle in the range of 30° to 50° from a Y direction.

In one example, the multilayer piezoelectric substrate (MPS) further comprises a third substrate layer of silicon dioxide as an adhesive material to bond the first and second layer.

In one example, the interdigital transducer electrodes comprises aluminum (Al) on molybdenum (Mo), tungsten (W), platinum (Pt), or copper (Cu).

In one example, the thickness of the plurality of interdigital transducer electrodes is 0.04 L to 0.2 L where L is the SAW wavelength.

In one example, the thickness is 0.04 L to 0.12 L for the Al electrode, and 0.0025 L to 0.03 L for Mo, W, Pt, or Cu, where L is the SAW wavelength.

In one example, the thickness of the piezoelectric material is 0.1 L to 0.5 L, where L is the SAW wavelength.

In one example, the thickness of the third substrate layer of adhesive is 0.1 L to 0.5 L, where L is the SAW wavelength.

According to another embodiment there is provided, an acoustic wave resonator comprising: a plurality of interdigital transducer electrodes; and a multilayer piezoelectric substrate (MPS) adjacent the plurality of interdigital transducer electrodes, the MPS including: a first substrate layer of a piezoelectric material; and a second substrate layer of silicon bonded to the first which is different from a silicon substrate, having a wafer cut angle and a propagation direction of the acoustic wave defined by a Euler angle of (90, 90, 45).

In one example, the second substrate of silicon is a silicon having a wafer cut angle and a propagation direction of the acoustic wave defined by a Euler angle of (90, 90, 90), (45, 90, 90) or (45, 54.74, 60).

In one example, the third Euler angle defines the propagation direction of the acoustic wave.

In one example, the propagation direction of the acoustic wave is in the range of −20° to 20° from the propagation direction defined by the Euler angle (90, 90, 90), or in the range of −5° to 5° from the propagation direction defined by the Euler angle (45, 54.74, 60).

In one aspect, an acoustic wave device that is configured to generate a surface acoustic wave having a wavelength L is disclosed. The acoustic wave device can include a piezoelectric layer. The piezoelectric layer has a thickness in a range of 0.1 L to 0.3 L. The acoustic wave device can include an interdigital transducer electrode over the piezoelectric layer, and a support substrate bonded to the piezoelectric layer such that the piezoelectric layer is positioned between the interdigital transducer electrode and the support substrate. The support substrate has a cut angle that is configured to provide a velocity of the surface acoustic wave, calculated by multiplying the wavelength L by a particular frequency, to be greater than 4800 m/s.

In one embodiment, the piezoelectric layer is a lithium tantalate layer. The lithium tatalate layer can be a 42±10° Y-X lithium tatalate layer.

In one embodiment, the cut angle of the support substrate is configured to provide the velocity of the surface acoustic wave to be greater than 5000 m/s. The cut angle of the support substrate can be configured to provide the velocity of the surface acoustic wave to be between 5060 m/s and 5800 m/s.

In one embodiment, the cut angle of the support substrate is in a range of, in Euler angle ($\varphi$, $\theta$, $\psi$), (90±15°, 90±15°, 90±15°).

In one embodiment, the cut angle of the support substrate is in a range of, in Euler angle ($\varphi$, $\theta$, $\psi$), (45±15°, 90±15°, 90±15°°).

In one embodiment, the cut angle of the support substrate is in a range of, in Euler angle ($\varphi$, $\theta$, $\psi$), (45±15°, 54.74±15°, 60±15°).

In one embodiment, the acoustic wave device further includes an adhesion layer between the piezoelectric layer and the support substrate.

In one embodiment, the acoustic wave device further includes a polycrystalline silicon layer or an amorphous silicon layer between the piezoelectric layer and the support substrate.

In one embodiment, the acoustic wave device further includes a silicon nitride layer or an aluminum nitride layer between the piezoelectric layer and the support substrate.

In one embodiment, the acoustic wave device further includes a polycrystalline silicon layer or an amorphous silicon layer, and a silicon nitride layer or an aluminum nitride layer between the piezoelectric layer and the support substrate.

In one aspect, an acoustic wave device is disclosed. The acoustic wave device can include a piezoelectric layer over the support substrate, an interdigital transducer electrode over the piezoelectric layer, and a support substrate bonded to the piezoelectric layer such that the piezoelectric layer is positioned between the interdigital transducer electrode and the support substrate. The support substrate has a cut angle in a range of, in Euler angle ($\varphi$, $\theta$, $\psi$), (90±15°, 90±15°, 90±15°, 45±15°, 90±15°, 90±15°°), or (45±15°, 54.74±15°, 60±15°).

In one embodiment, the piezoelectric layer is a lithium tantalate layer. The lithium tatalate layer can be a 42±10° ° Y-X lithium tatalate layer.

In one embodiment, the acoustic wave device is configured to generate a surface acoustic wave having a wavelength L, and the piezoelectric layer has a thickness in a range of 0.1 L to 0.3 L In one embodiment, the cut angle of the support substrate is configured to provide the velocity of the surface acoustic wave to be between 5060 m/s and 5800 m/s.

In one embodiment, the acoustic wave device further includes a polycrystalline silicon layer or an amorphous silicon layer between the piezoelectric layer and the support substrate.

In one embodiment, the acoustic wave device further includes a silicon nitride layer or an aluminum nitride layer between the piezoelectric layer and the support substrate.

In one embodiment, the acoustic wave device further includes a polycrystalline silicon layer or an amorphous silicon layer, and a silicon nitride layer or an aluminum nitride layer between the piezoelectric layer and the support substrate.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

The present disclosure relates to U.S. patent application Ser. No. 17/938,274, titled "MULTILAYER PIEZOELECTRIC SUBSTRATE SURFACE ACOUSTIC WAVE DEVICE WITH SPURIOUS SHIFTING," filed on even date herewith filed on even date herewith, the entire disclosure of which are hereby incorporated by reference herein.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure.

FIG. 4A-1 is a schematic crystal plane representation illustrating a [001] direction on a (100) surface of a silicon substrate.

FIG. 4A-2 is a schematic crystal plane representation illustrating a [011] direction on a (100) surface of a silicon substrate.

FIGS. 4B-1 and 4B-2 are schematic top views of two configurations of silicon substrates shown in FIGS. 4A-1 and 4A-2 with respect to bonded piezoelectric substrate layers.

FIGS. 6A-6G show seven different configurations of silicon substrates having three different cut angles: (100), (110) and (111).

FIG. 7 is a graph showing simulation results of the conductance of the seven different configurations of the silicon substrates shown in FIGS. 6A-6G.

FIG. 10A illustrates propagation direction angles of a wave in a silicon substrate having a (100) cut angle.

FIG. 10B is a graph showing simulation results of conductance in a silicon substrate having a (100) cut angle for the propagation angles shown in FIG. 10A.

FIG. 10C is a graph showing simulation results of reflection coefficient (gamma) in a silicon substrate having a (100) cut angle for the propagation angles shown in FIG. 10A.

FIG. 11A is a schematic cross sectional side view of a surface acoustic wave (SAW) device according to an embodiment.

FIG. 11B is a schematic cross sectional side view of a surface acoustic wave (SAW) device according to another embodiment.

FIG. 12A shows simulated admittance results of the SAW device of FIG. 1 for different support substrates.

FIG. 12B shows simulated conductance results of the SAW device of FIG. 1 for the different support substrates.

FIG. 12C shows simulated admittance results of the SAW device of FIG. 11A for different support substrates.

FIG. 12D shows simulated conductance results of the SAW device of FIG. 11A for the different support substrates.

FIGS. 13A-13E are graphs showing simulated conductance results of the SAW device of FIG. 11A having a silicon substrate with a cut angle of (90, 90, 45)

FIGS. 14A-14E are graphs showing simulated conductance results of the SAW device of FIG. 11A having a silicon substrate with a cut angle of (90, 90, 90).

FIGS. 16A-16E are graphs showing simulated conductance results of the SAW device of FIG. 11A having a silicon substrate with a cut angle of (45, 54.74, 90).

FIG. 17 is a chart showing twenty-five (25) parameter sets of various SAW devices.

DETAILED DESCRIPTION

Figure 1:
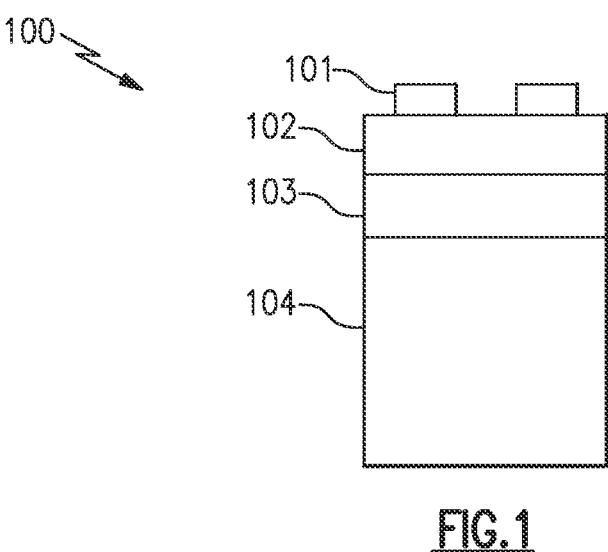
FIG. 1 is a schematic side view of a surface acoustic wave resonator that includes a multilayer piezoelectric substrate (MPS) structure according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A substrate including a piezoelectric material layer bonded to a layer of material such as silicon may be referred to as a multilayer piezoelectric substrate (MPS) herein. A silicon support substrate has been conventionally used in a MPS structure. Silicon has a thermal conductivity of about 1.3 W/cmK, and is significantly less fragile than lithium niobate and lithium tantalate. The use of silicon support substrate can increase the mechanical robustness of the piezoelectric substrate during fabrication of SAW resonators on the substrate, increasing manufacturing yield, and reduce the amount by which operating parameters of the SAW resonators formed on the piezoelectric substrate change with temperature during operation. The silicon support substrate conventionally used is Si{100}<110> that has a cut angle of the silicon crystal at {100} and a propagation of acoustic waves in a direction of <110>. In some applications, Si{100}<110> may have a large amount of reflection characteristic noise, which is also referred to as spurious signals. The spurious signals are normally found in high-frequency ranges and are undesirable. A modification and optimization of the configuration of the silicon substrate in the MPS structure is desirable, in order to effectively suppress spurious signals and achieve a better reflection characteristics across a broader range including the high-frequency ranges.

Aspects and embodiments described herein are directed to an acoustic wave device having a multilayer piezoelectric substrate (MPS) structure. The acoustic wave device can include a plurality of interdigital transducer electrodes over the multilayer piezoelectric substrate (MPS) structure. The MPS structure can include a first substrate layer of a piezoelectric material (e.g., a piezoelectric layer) and a second substrate layer of silicon (e.g., a silicon support substrate) bonded to the first layer. The silicon having a cut direction and/or acoustic wave propagation direction that can prevent or mitigate a bulk leak. The cut direction and/or acoustic wave propagation direction can be different from those of a particular silicon substrate. The particular silicon substrate can have a cut direction and a propagation direction property defined by the silicon cut angle of {100} and the propagation direction <110>. For example, the cut direction and the acoustic wave propagation direction of the silicon support substrate can be (100 and <100> respectively.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). A SAW resonator can be configured to generate, for example, a Rayleigh mode surface acoustic wave or a shear horizontal mode surface acoustic wave. Although embodiments may be discussed with reference to SAW resonators, any suitable principles and advantages disclosed herein can be implemented in any suitable SAW device.

In general, high quality factor (Q), large effective electromechanical coupling coefficient ($k^2$), high frequency ability, and spurious free response can be significant aspects for micro resonators to enable low-loss filters, stable oscillators, and sensitive sensors.

The use of a multilayer piezoelectric substrate (MPS) structure including a silicon substrate instead of a single-layer substrate may be beneficial for both thermal and mechanical properties of a surface acoustic wave (SAW) device based on the MPS structure. Multi-layer piezoelectric substrates can provide good thermal dissipation characteristics and improved temperature coefficient of frequency (TCF) relative to certain single layer piezoelectric substrates. For example, certain SAW resonators with a piezoelectric layer on a high impedance layer, such as silicon, can achieve a better temperature coefficient of frequency (TCF) and thermal dissipation compared to similar devices without the high impedance layer. A better TCF can contribute to obtaining the large effective electromechanical coupling coefficient ($k^2$). The use and configuration of a silicon substrate or wafer with respect to the SAW propagation may be optimized to achieve ideal reflection characteristics by suppressing spurious signals, in particularly at a high frequency range.

Embodiments of the present disclosure aim to locate desired crystal cuts of silicon for SAW resonator applications. This may be done by generating a set of theoretical simulations of SAW properties (e.g., reflection characteristics) at various SAW propagation orientations and particular crystal cuts of interest. Desirable cuts and configurations may then be implemented in practice.

Silicon wafers can be grown from crystal having a regular crystal structure. When cutting into wafers, the surface is aligned in one of several relative directions known as crystal orientations. The orientation can be defined by the Miller index with (100), (110), and (111) faces being the most common for silicon.

As is known in the art, the Miller Index can be used to define planes and directions in the crystal lattice, relative to X, Y, and Z axes that are aligned with the cubic lattice of the lattice. Further, a bracket convention is used to distinguish between specific directions and planes or their equivalents. For example, the following notations can be used: a [ ] bracket notation identifies a specific direction in the crystal lattice, while a < > notation identifies a family of equivalent directions; a ( ) notation identifies a specific plane, while a notation identifies a family of equivalent planes. Thus, briefly referring to FIG. 4A, the Miller Notation Si (100) indicates the shaded plane 411, the vector notation 100 being used to indicate a vector perpendicular to the direction of the plane in X axes direction of the crystal lattice. Si (110) (see, for example, FIGS. 6C-6E) on the other hand indicates a crystal plane with a normal vector arranged at 45 degrees to the X and Y crystal axes direction, while Si (111) (see, for example, FIGS. 6F-6G) indicates a plane at 45 degrees to the X, Y and Z crystal axes. Similarly, in FIG. 4A, the notation [001] indicates a direction 413 pointing along the Z axis, while [011] indicates a direction 423 pointing 45 degrees to the Y and Z axes. In the description that follows, the bracket notation for referring to lattice planes will generally be used to define the plane in which the silicon wafer is cut or ground, while the bracket notation indicating direction will be used to indicate the direction of propagation in the silicon of the acoustic wave.

The propagation direction of the acoustic wave in the silicon wafer relative to the silicon crystal lattice will depend at least in part on the relative orientation of the silicon wafer to the piezoelectric material. This disclosure will therefore consider combinations of the planar cut direction of the silicon crystal wafer relative to its crystal lattice, and the propagation direction of the acoustic wave in the crystal.

The orientation is important since many of a single crystal's structural and electronic properties are highly anisotropic, which means that different crystal orientations give rise to different properties. In the semiconductor industry, the commonly used wafers may have diameters under 200 mm. These wafers have flats cut into one or more sides indicating the crystallographic planes of the wafer. In some embodiments, silicon wafers that have cut angles {100}, {110}, and {111} may be utilized.

The SAW propagation direction may also be varied. In some embodiments, the SAW propagation direction may be altered through patterning the plurality of IDT electrodes. For example, SAW resonators can be patterned so that the direction of propagation of SAW coincides with the direction of the x axis. In some other embodiments, the SAW propagation direction may be altered through aligning the silicon substrate with the plurality of IDT electrodes so that the direction of the x axis coincides with the direction of propagation of SAW. A set of measured and simulation results may then be presented for different configurations of silicon cut angles and SAW propagation directions. The characteristic results can be based on a MPS structure for SAW resonators which will be discussed in FIGS. 1, 2A, and 2B.

FIG. 1 is a schematic side view of a surface acoustic wave (SAW) device 100. The SAW device 100 can include a multilayer piezoelectric substrate (MPS) structure instead of a single-layer substrate. As illustrated in FIG. 1, the MPS structure can include a first substrate layer 102 of piezoelectric material (e.g., a piezoelectric layer). In some embodiments, the first substrate layer 102 can include a lithium tantalite (LiTaO₃, LT) layer or a lithium niobate (LiNbO₃) layer.

The MPS structure can include a support substrate 104 (e.g., a second substrate layer of silicon substrate). The support substrate 104 can be bonded to the first substrate layer 102. The support substrate may be bonded to the piezoelectric layer by way of an adhesive or a direct fusion bond. In some embodiments, a third substrate layer of an adhesive material 103, for example silicon dioxide (SiO₂), may be disposed between the support substrate and the piezoelectric layer. In some embodiments, the adhesive material 103 (e.g., a layer of SiO₂) may be grown or deposited on the lower surface of the piezoelectric layer and a layer of SiO₂ may be grown or deposited on an upper surface of the support substrate. The piezoelectric layer and the support substrate may be joined by anodic bonding or other methods of joining layers of $SiO_2$ known in the art. In some embodiments, a metal layer (e.g., titanium (Ti)) may be used as the adhesive material 103. A plurality of electrodes 101 are deposited over the top surface of the MPS, including interdigital transducer (IDT) electrodes and reflector electrodes. A detailed demonstration is shown in FIG. 2A.

The relative thickness of the support substrate 104 (e.g., the second silicon substrate layer) and the piezoelectric layer (e.g., the first substrate layer 102) may affect properties of the MPS, for example, the thermal coefficient of frequency of the MPS. Silicon has a lower coefficient of thermal expansion (around 2.6 ppm/K) than a piezoelectric material such as lithium tantalate (from 4 ppm/° K to 16/° K, depending on crystallographic directions). Bonding a layer of silicon to a layer of lithium tantalate to form a MPS may thus restrain the change in dimensions of the lithium tantalate layer with changes in temperature as compared to only a lithium tantalate substrate without a bonded silicon layer. The thicker the silicon layer as compared to the thickness of the lithium tantalate layer, the more the silicon layer may stabilize the properties of the MPS with respect to changes in temperature. According to some embodiments, the thickness of the lithium tantalate layer may be 0.2 L and the thickness of the silicon layer may be 5 L, where L is the wavelength of the main acoustic wave excited by the SAW resonator. In some embodiments which include a third substrate layer of adhesive material 103, such as silicon dioxide, the thickness of the third substrate layer of adhesive material 103 may be around 0.2 L. In some embodiments, a wider range of thickness may be applicable which may be 0.1 L to 0.5 L thickness for the piezoelectric layer and the adhesive layer, respectively.

Figure 2A:
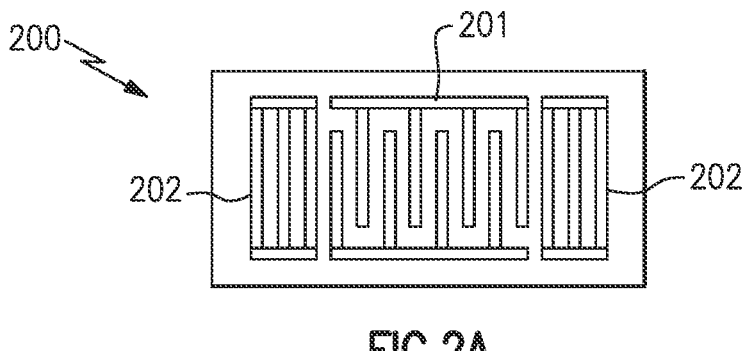
FIG. 2A is a schematic top view of the surface acoustic wave resonator shown in FIG. 1.
Figure 2B:
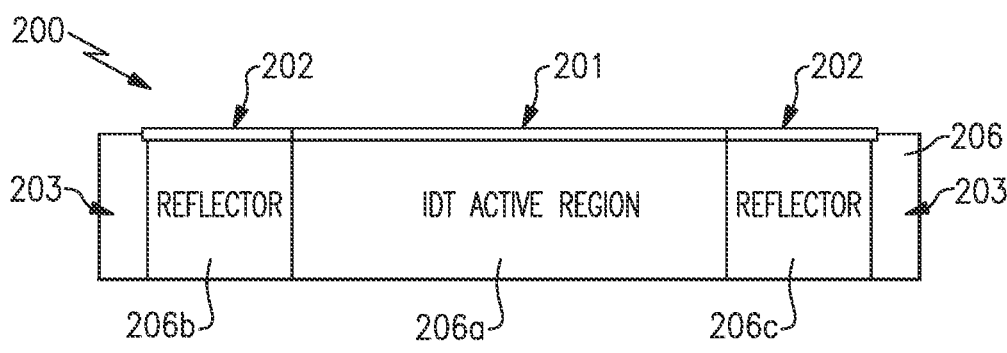
FIG. 2B is an overview of a distribution of an interdigital transducer electrode and reflectors of FIG. 2A according to an embodiment.

FIG. 2A shows a schematic top plan view of a SAW resonator 200 including interdigital transducer (IDT) electrodes 201 and reflector electrodes 202 at opposing sides of IDT electrodes 201. The reflector electrodes 202 is disposed such that the IDT electrodes 201 is positioned between the reflector electrodes 202 and configured to reflect the main acoustic wave back and forth through the IDT electrodes 201. FIG. 2B shows a general distribution of the IDT electrode 201 and the reflector electrodes 202 on a piezoelectric layer 206. The main acoustic wave of the device can travel generally perpendicular to the longitudinal or lengthwise direction of the IDT electrodes 201. As shown in FIG. 2B, the length of the piezoelectric layer 206 can be divided by different sections of the electrodes. According to one embodiment, the IDT electrodes 201 which represent the active region 206a for the SAW resonator 200 may have a length of about 75 L, where L is the wavelength of the main acoustic wave excited by the SAW resonator 200. The reflector electrodes regions 206b, 206c at opposing sides of the IDT active region 206a can have a length of about 12.5 L. The piezoelectric layer 206 can include one or more free spaces 203 at or near one or more edge regions of the piezoelectric layer 206. Each of the free spaces 203 may have a length of about 3 L. In some embodiments, the wavelength L may be 2 μm. The IDT electrodes 201 may be formed by vacuum evaporation or sputter coating, in some embodiments. The finger width of the IDT electrodes 201 may be appropriately determined depending on the frequency to which the SAW resonator 200 is applied.

In some embodiments, the IDT electrodes 201 and reflector electrodes 202 may include aluminum (Al) electrodes. The thickness of the Al electrode may be around 0.08 L. In some embodiments, the thickness of the Al electrode can be in a range of 0.04 L to 0.2 L. In some embodiments, the IDT electrodes 201 and reflector electrodes 202 can be multilayer electrodes including a layer of a highly conductive but low-density material, for example, aluminum (Al), and a layer of a more dense material, for example, aluminum (Al) on molybdenum (Mo), tungsten (W), platinum (Pt), or copper (Cu). The denser layer may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense layer may have a higher conductivity than the lower layer, in order to provide electrode stack with a lower overall resistivity. The thickness of Al as an upper layer electrode may be around 0.04 L to 0.12 L, and the thickness of Mo, W, Cu or Pt as a lower layer electrode may be around 0.0025 L to 0.03 L. The electrodes may include alloys, such as AlMgCu, AlCu, etc.

It should be appreciated that the acoustic wave devices 100, 200 illustrated in FIGS. 1, 2A and 2B, as well as the other circuit elements illustrated herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes positioned between the reflector electrodes 202.

The MPS may include a first substrate layer of a piezoelectric material. The piezoelectric layer of the MPS structure may be fixed according to the present disclosure. There are many different types of lithium tantalate crystal substrates which are usually cut in the form of wafers. They are thin slices having at least one planar surface cut with a particular orientation that gives desired features including temperature stability of frequency and delay, velocity, coupling coefficient, and etc. The surface of the crystal on which the electrodes are to be placed is made flat and smooth before the electrodes are placed upon it.

Figure 3B:
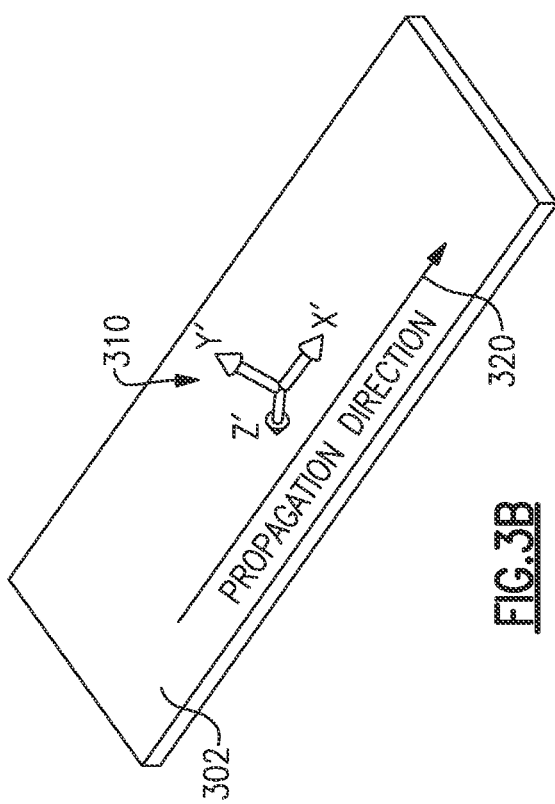
FIG. 3B is a schematic perspective view of the lithium tantalate layer showing the 42° Y-X lithium tantalate crystal and a surface acoustic wave (SAW) propagation direction.
Figure 3A:
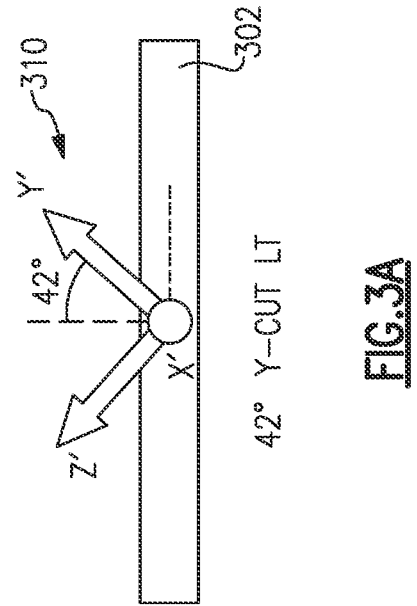
FIG. 3A is a schematic side view of a lithium tantalate layer showing 42° Y-X lithium tantalate crystal axes.

FIG. 3A is a schematic side view of a lithium tantalate layer 302 with crystal orientation 310. FIG. 3B is a schematic perspective view of the lithium tantalate layer 302 with the crystal orientation 310 and the propagation direction 320 of an acoustic wave that propagates in the lithium tantalate layer 302. The crystal orientation 310 is illustrated with reference to the crystallographic or crystal lattice axes X, Y, and Z, and can be understood as the orientation of those axes relative to the planar direction in which the substrate extends, which in turn is determined by the cut direction of the lithium tantalate layer 302. A Y-cut LT substrate for example would be cut such that the planar surface of the cut substrate has a normal vector extending along the Y axis of the crystal lattice. The axes, X and Z are then in plane of the lithium tantalate layer 302.

Euler angles are used to describe the orientation of a rigid body with respect to a fixed coordinate system, which in this case is usefully taken as the crystal lattice axes X, Y, and Z. The second Euler angle in the notation (α, β, γ) represents a rotation around the X axis. Thus, a Y cut LT substrate can be described in Euler notation as (0, −90, 0) indicating that the conventional axes X and Y in the wafer plane and the Z axis, conventionally out of the wafer plane, have been rotated around the X axis by 90 degrees, such that the Y axis (now Y' axis) is out of the plane. In this notation X', Y', and Z' still refer to the crystal axes.

The wafer cut shown in FIGS. 3A and 3B is therefore be understood as being a 42 degree Y-cut out wafer. With respect to the X, Y, and Z axes of the cubic crystal lattice, the wafer cut out direction is at 42 degrees to the Y axis, which, keeping the x axis direction pointing along the plane of the substrate, necessarily also rotates the conventional Z axis direction (now Z' axis) out of the wafer. In FIGS. 3A and 3B, the relevant Euler angle are (0, 42-90, 0). In embodiments, the cut angle of an LT layer may be between 30 and 60 degrees with respect to the Y axis, that is (0, 30-90, 0) and (0, 60-90, 0).

FIGS. 3A and 3B therefore represent a 42° Y-cut X-propagation LT (42Y-X LT, or 42Y LT). As shown in FIG. 3A, the 42° Y-cut plane is a rotation of 42° from a Y-cut plane. The propagation direction 320 of acoustic waves is shown in FIG. 3B which is along the x axis of the cut plane of the lithium tantalate layer 302. In some embodiments, the cut angle of the lithium tantalate layer 302 may be fixed to 42° Y-cut LT. For example, the lithium tatalate layer 302 can be 42±15° Y-cut LT, 42±10° Y-cut LT, or 42±5° Y-cut LT. In some other embodiments, lithium niobate (LN) may be used as the piezoelectric material. For example, a −15° to 15° Y-cut LN or 128° Y-cut LN may be used for the piezoelectric layer.

The different configurations of silicon substrates are shown in FIGS. 4A-1 and 4A-2. Conventionally, a combination of a silicon cut angle {100} and propagation direction at <110> is used. It should be noted that the notations of Miller indices (h, k, and l) could be either "(hkl)" for describing a plane or "{hkl}" for describing a set of all planes that are equivalent to (hkl) by the symmetry of the lattice; and could be either "[hkl]" for describing a direction or "<hkl>" for describing a set of all directions that are equivalent to [hkl] by symmetry.

There may be other configurations of silicon with different cut angle and propagation directions of SAW that give rise to improved or better SAW characteristics in a SAW device. The silicon substrate having a cut angle {100} and a propagation direction at <110> may be referred to as a baseline or conventional silicon substrate herein. The baseline silicon substrate may be a reference which may be modified for achieving a set of new configurations. In some embodiments, the new configuration may be a configuration of Si{100}<100>. FIGS. 4A-1 and 4A-2 show representative images of a substrate 410 that includes Si(100)[100] and a substrate 420 that includes the conventional Si(100)[110]. Both silicon substrates 410, 420 have a cut angle of (100) in the main axes X, Y, Z. The cut planes (100) for the silicon substrates 410, 420 are highlighted in FIG. 4A by the shaded planes 411, 421, respectively. A difference of the two samples of silicon substrates 410, 420 is their propagation directions 413, 423 of the SAW as represented by the arrows in FIGS. 4A-1 and 4A-2, which is in the [001] direction and in the [011] direction respectively. In a notation system, the orientations for SAW propagation for a given crystal can be defined by the Euler angles ($\varphi$, $\theta$, $\psi$). The first two Euler angles $\varphi$ and $\theta$ define the crystal cut and the third Euler angle $\psi$ defines the direction of acoustic wave propagation in that cut. Thus, an acoustic wave propagation orientation in the crystal can be identified by a unique set of all three Euler angles. The Euler angles of the substrate 410 are $\varphi$=90°, $\theta$=90°, $\psi$=90°, and the Euler angles of the substrate 420 are $\varphi$=90°, $\eta$=90°, $\psi$=45°.

FIG. 4B-1 is a schematic top plan view of a SAW device 430. The SAW device 430 can include a silicon substrate 410, a piezoelectric layer 412 over the silicon substrate 410, and an IDT electrode 432 over the piezoelectric layer 412. FIG. 4B-2 is a schematic top plan view of a SAW device 434. The SAW device 434 can include a silicon substrate 420, a piezoelectric layer 422 over the silicon substrate 420, and an IDT electrode 432 over the piezoelectric layer 412. In some embodiments, the piezoelectric layer 412, 422 may be 42° Y-cut X-propagation LT as described in FIGS. 3A and 3B. In FIGS. 4B-1 and 4B-2, the IDT electrodes 432, 436 are shown on the piezoelectric layer 412, 422 with a propagation direction 413 for the SAW device 430 and a propagation direction 423 for the SAW device 434. The <100> and <110> directions are also shown in FIGS. 4B-1 and 4B-2. The <100> direction is perpendicular to the orientation flat (the flat edge of the silicon substrate). The alignment of crystal direction of silicon substrates 410, 420 with the propagation directions 413, 423 of the SAW may be changed by adjusting or rotating the orientation of the silicon substrates 410, 420, while the propagation direction 413, 423 of the SAW relative to the piezoelectric layers 412, 422 are fixed. As shown in FIG. 4B-1, a <100> crystal direction is aligned with the propagation direction 413 of the SAW in the SAW device 430. The silicon substrate 410 may be rotated, such as in 45°, to align a <110> crystal direction with the propagation direction of the SAW. As shown in FIG. 4B-1, a <100> crystal direction is angled relative to the propagation direction 423 of the SAW in the SAW device 434. In some embodiments, the alignment or adjustment of silicon crystal orientations with the propagation direction of the SAW may be achieved by changing the propagation direction of SAW with respect to the crystal orientation. This may be achieved by changing arrangement of the IDT electrodes 432, 436 of the SAW devices 430, 434 and/or the third Euler angle ($\psi$) of the piezoelectric layer 412, 422 which represents the propagation direction of SAW.

Figure 5A:
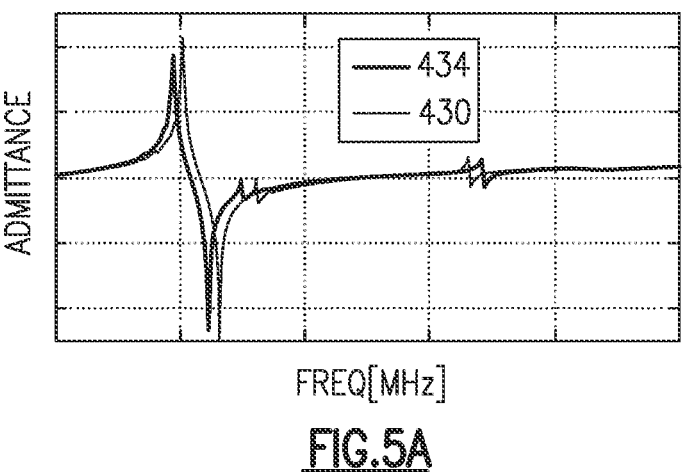
FIG. 5A is a graph showing results of measured admittance of the two configurations of silicon substrates shown in FIGS. 4B-1 and 4B-2.
Figure 5B:
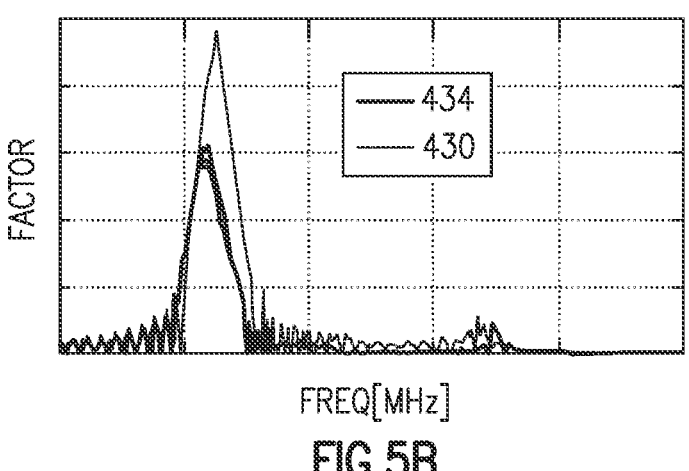
FIG. 5B is a graph showing results of measured quality factor (Q) of the two configurations of the silicon substrates shown in FIGS. 4B-1 and 4B-2.
Figure 5C:
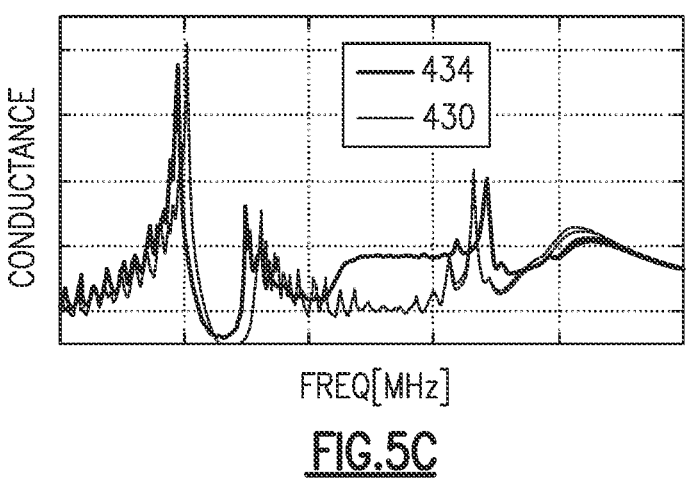
FIG. 5C is a graph showing results of measured conductance of the two configurations of the silicon substrates shown in FIGS. 4B-1 and 4B-2.

FIGS. 5A to 5C are graphs showing the measured results of admittance (FIG. 5A), quality factor (Q) (FIG. 5B), and conductance (FIG. 5C) of the SAW devices 430, 434 with respect to a frequency range from 500 MHz to 1 GHz. The results of the measured frequency response of the complex admittance of the SAW resonator is illustrated in FIG. 5A. FIG. 5A indicates that when Si{100}<100> is used as the substrate 410, the SAW device 430 can have relatively large depth and sharpness on both the resonance and anti-resonance peaks. FIG. 5B shows the Q measured with respect to frequency for the SAW device 430 with Si{100}<100> as the substrate 410 and the SAW device 434 with Si{100}<110> as the substrate 420. The Q is a dimensionless parameter, and is defined as the ratio of the initial energy stored in the resonator to the energy lost in one radian of the cycle of oscillation. As shown in FIG. 5B, the curve of the SAW device 430 with the Si{100}<100> substrate shows a higher Q than the curve of the SAW device with the Si{100}<110> substrate, which indicates a lower rate of energy loss. FIG. 5C shows the conductance of the SAW devices 430, 434. The curve of the SAW device 430 with the Si{100}<100> substrate shows a suppression of spurious signals especially at higher frequencies compared with the curve of the SAW device 434 with the Si{100}<110> substrate. Overall, FIGS. 5A to 5C all demonstrate that the use of Si{100}<100> substrate shows better characteristics than the conventionally used Si{100}<110> substrate.

More combinations of cut angles and propagation directions are considered for silicon substrates, and are compared to each other. As shown in FIGS. 6A-6G, seven different configurations of substrates with different cut angles and propagations are shown. The different configurations of FIGS. 6A-6G are divided into three groups by three different cut angles of a silicon substrate. The first group includes FIGS. 6A and 6B that show silicon substrates 611, 612 having a cut angle of (100) with two different propagation directions of a surface acoustic wave (SAW) as noted by the third Euler angle ψ=90° and ψ=45°, respectively. The second group includes FIGS. 6C-6E that show silicon substrates 621, 622, 623 having a cut angle of (110) with three different propagation directions of the SAW as noted by the third Euler angle ψ=90°, ψ=0° and ψ=35.26°, respectively. The third group includes FIGS. 6F and 6G that show silicon substrates 631, 632 having a cut angle of (111) with two different propagation directions of the SAW as noted by the third Euler angle ψ=90° and ψ=60°, respectively.

FIG. 7 illustrates the results of finite element method (FEM) non-periodic two-dimensional (2D) simulations of various SAW devices. The SAW devices used in the simulations commonly include Al electrodes (0.08 L thickness), 42° Y-cut LT (0.2 L), and silicon dioxide (0.2 L). The SAW devices include the silicon support substrates 611, 612, 621, 622, 623, 631, 632 of FIGS. 6A-6G. Conductance, the real part of admittance, of each SAW device is simulated with respect to frequency change from 1600 MHz to 3000 MHz (or 1.6 GHz to 3 GHz) as shown in FIG. 7. The silicon support substrates are Si{100}, ψ=90° (the substrate 611), Si{100}, ψ=45° (the substrate 612), Si{110}, ψ=90° (the substrate 621), Si{110}, ψ=0° (the substrate 622), Si{110}, ψ=35.26° (the substrate 623), Si{111}, ψ=90° (the substrate 631), and Si{111}, ψ=60° (the substrate 632).

FIG. 7 indicates that there is no significant difference between the seven curves in the low frequency range of around 1600 MHz to 2300 MHz (or 1.6 GHz to 2.3 GHz). However, a main difference can be seen at a higher frequency band around 2300 MHz to 3000 MHz (or 2.3 GHz to 3.0 GHz). From 2.3 GHz frequency, the SAW device with the substrate 612 starts to show some spurious signals. The SAW devices with the substrates 623, 631 also show spurious signals in the frequency band from around 2.5 GHz to 3.0 GHz. The SAW device with the substrate 622 shows spurious signals at higher frequencies ranging from 2.6 GHz to 3 GHz. FIG. 7 indicates that the SAW devices with the substrates 612, 622, 623, 631 may cause spurious signals at respective frequency bands. In contrast, the curves for the SAW devices with the substrates 611, 621, 632 have much less "noise", indicating that the use of silicon substrates 611, 621, 632 tends to effectively suppress the spurious signals.

Figures 6A, 6B:
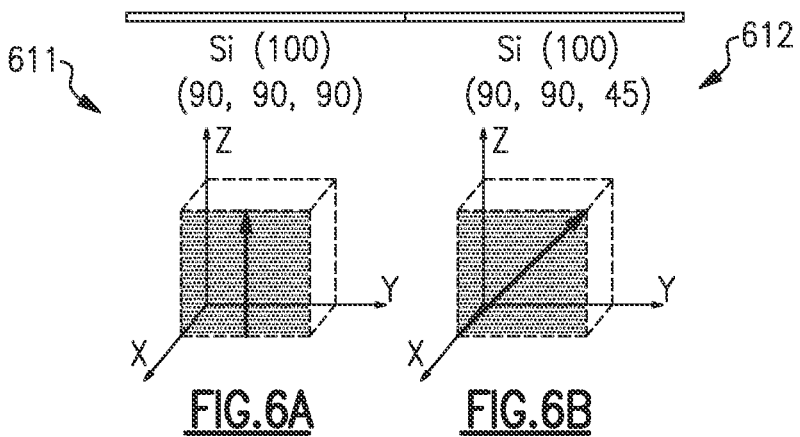
Figure 6D:
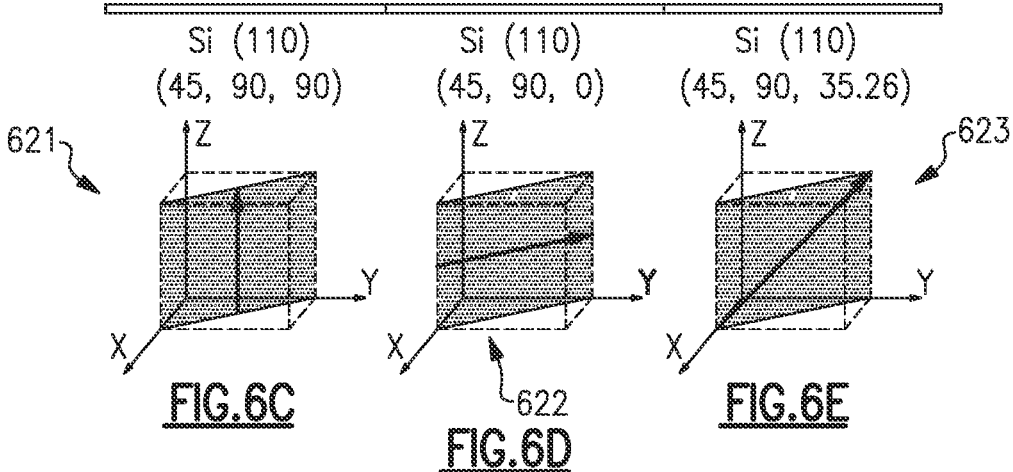
Figures 6F, 6G:
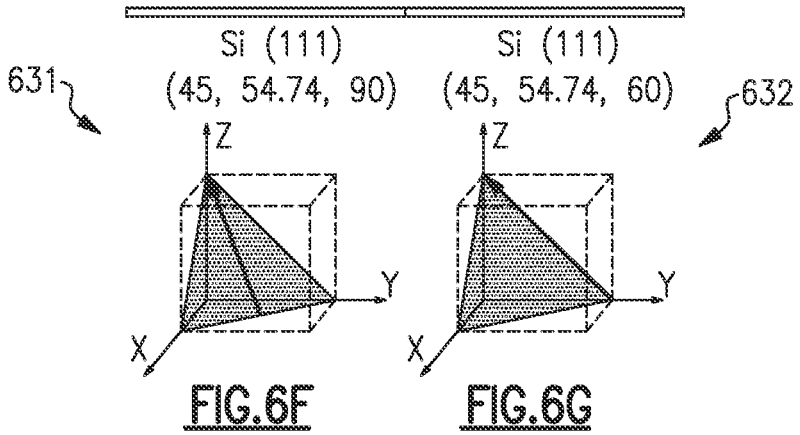
Figures 8A, 8B, 8C, 8D:
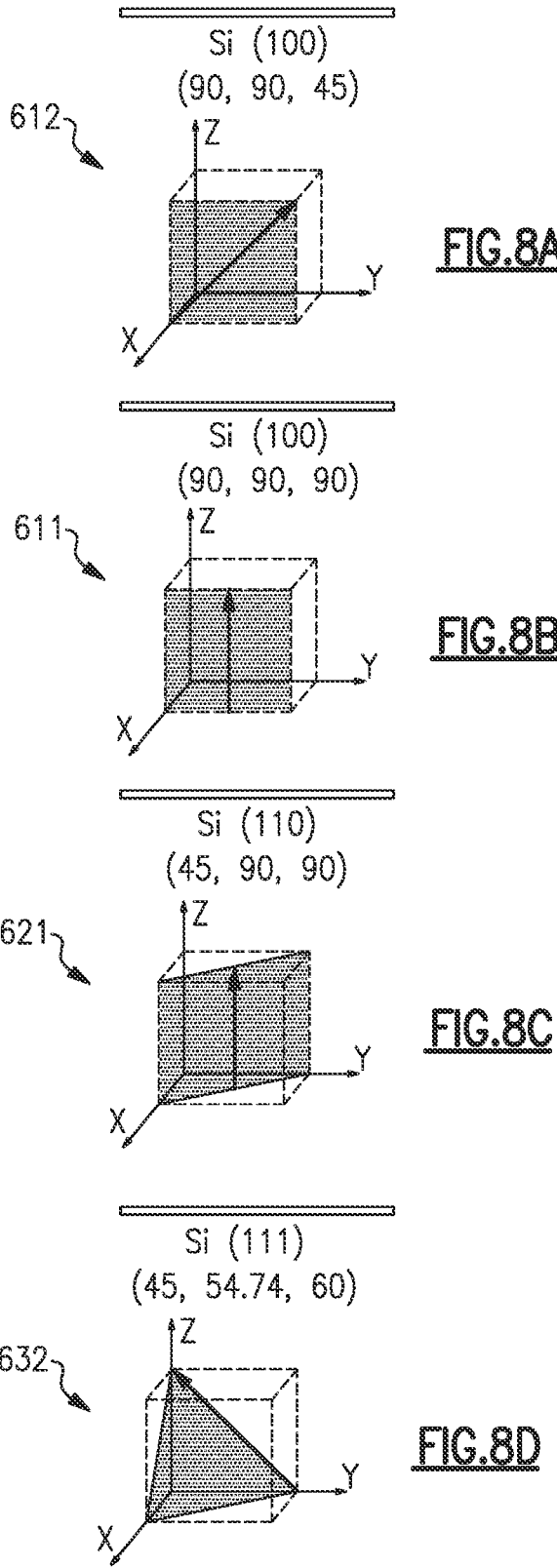
FIGS. 8A-8D show four different configurations of silicon substrates of FIGS. 6B, 6A, 6C, and 6G, respectively, reproduced for illustration purposes.

FIGS. 8A-8D show four different configurations of silicon substrates of FIGS. 6B, 6A, 6C, and 6G, respectively, reproduced for illustration purposes. FIG. 8A shows the substrate 612 of FIG. 6B, FIG. 8B shows the substrate 611 of FIG. 6A, FIG. 8C shows the substrate 621 of FIG. 6C, and FIG. 8D shows the substrate 632 of FIG. 6G.

Figures 9A, 9B:
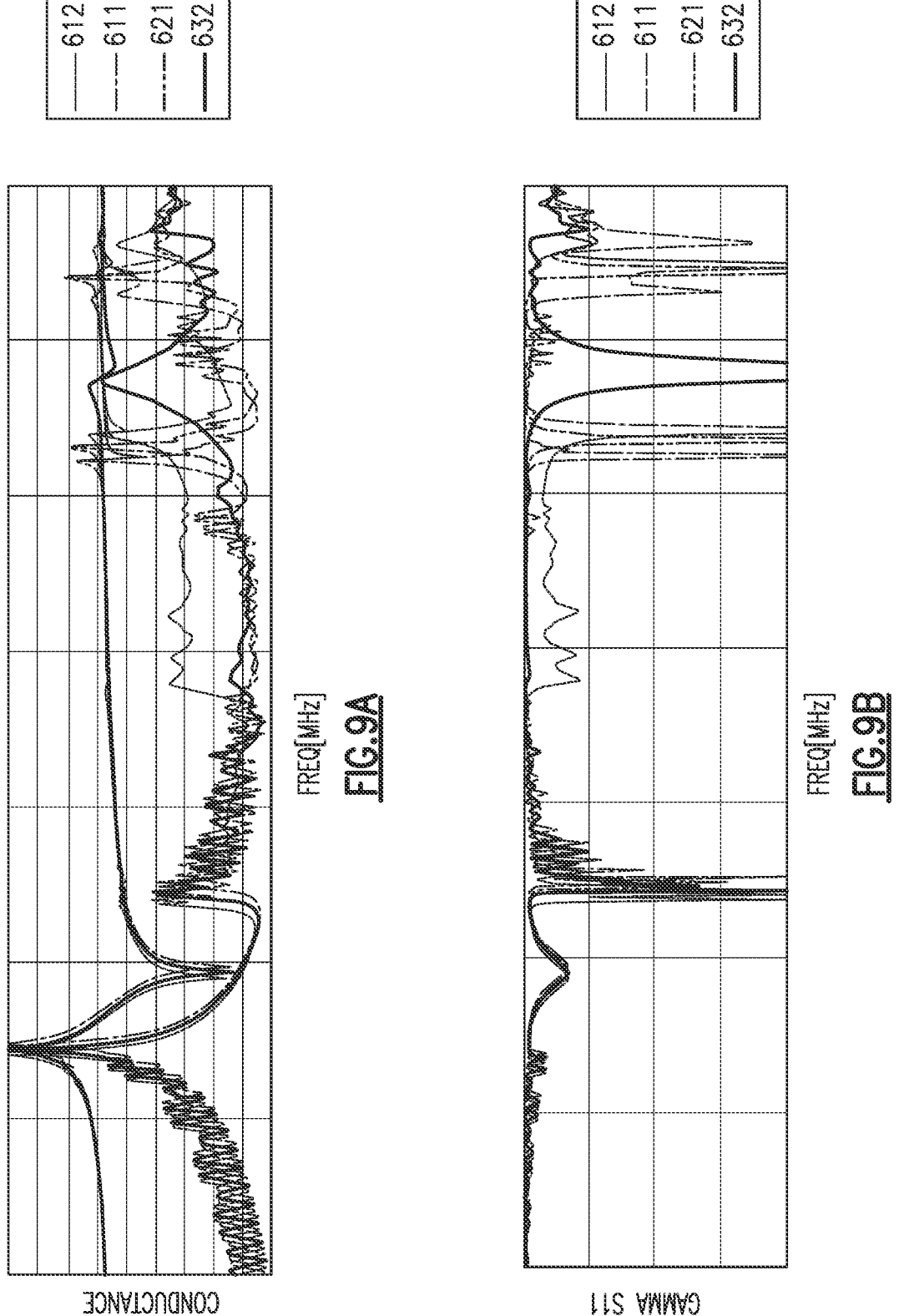
FIG. 9A is a graph showing simulation results of the complex and real part of admittance of the four different silicon substrates shown in FIG. 8.
FIG. 9B is a graph showing simulation results of the reflection coefficient (gamma) of the four different silicon substrates shown in FIG. 8.

FIGS. 9A and 9B show results of finite element method (FEM) non-periodic two-dimensional (2D) simulations of various SAW devices. The SAW devices used in the simulations commonly include Al electrodes (0.08 L thickness), 42° Y-cut LT (0.2 L), and silicon dioxide (0.2 L). The SAW devices include the silicon support substrates 61, 611, 621, 632 of FIGS. 8A-8D. In FIG. 9A, the complex admittance and the real part of admittance (e.g., the conductance) of the SAW devices with the silicon support substrates 61, 611, 621, 632 are simulated with respect to frequency change from 1600 MHz to 3000 MHz (or 1.6 GHz to 3 GHz). The complex admittance results of the SAW devices do not show a significant difference. However, the conductance results of the SAW devices can be distinguished, especially in a higher frequency range.

The conductance results in FIG. 9A are similar to FIG. 7, but a further conclusion may be drawn. The conductance result of the SAW device with the substrate 612 in FIG. 9A shows significant spurious signals at a high frequency range.

However, the conductance result of the SAW device with the substrate 611 may be more ideal which gives much less unwanted signals. The substrate 612 represents the conventionally used silicon substrate for SAW resonators as discussed above, which has a cut angle at {100} and a propagation direction of SAW at <110> (also can be expressed as Euler angles: ψ=90°, θ=90°, ψ=45°. The substrate 611 represents one of the proposed silicon substrates according to an embodiment, having a cut angle at {100} and a propagation direction of SAW at <100> (also can be expressed as Euler angles: φ=90°, θ=90°, ψ=90°. Therefore, by comparing the substrates 612, 611, the results of FIG. 9A indicate that when the cut angle is the same or generally similar (both {100}), the SAW propagation direction in <100> may provide better characteristics than the SAW propagation direction in <110>.

In FIG. 9A, the results of the SAW device with the substrate 611 and the SAW device with the substrate 621 are similar, in which the unwanted noise is suppressed as compared to the result of the SAW device with the substrate 612. In some embodiments, the substrate 621 having a cut angle at {110} and a propagation direction at <100> (Euler angles: φ=45°, θ=90°, ψ=90° can be used as the support substrate. The substrates 611, 621 have different cut angles but the same or generally similar propagation directions of SAW in <100>. The results of FIG. 9A indicates that when the SAW propagation direction is fixed at <100>, any silicon wafer with any cut angle may give rise to generally good characteristics.

In some propagation directions other than <100>, certain cut angles of the support substrate (e.g., a silicon substrate) may not provide an ideal performance. FIG. 9A indicates that the result of the SAW device with the substrate 632 has relatively smooth conductance characteristics. The substrate 632 represents the silicon substrate having a cut angle at {111} and a propagation direction of SAW at <110> (Euler angles: φ=45°, η=54.74°, ψ=60°. The SAW device with the substrate 632 and the SAW device with the substrate 612 have the same or generally similar SAW propagation directions at <110>, but the characteristics of the result of the SAW device with the substrate 632 are improved relative to the characteristics of the result of the SAW device with the substrate 612 does not provide.

FIG. 9A indicates that when the propagation direction of SAW is at <100>, the cut angle of the silicon wafer may not influence the characteristic results significantly. A propagation direction of the SAW in <100> may can provide a generally good characteristics with any arbitrary cut angle. The propagation direction of the SAW in <110> can provide a good characteristics when the cut angle of the silicon wafer is {111}.

FIGS. 7 and 9A indicate three support substrate cut angles that can provide particularly preferable characteristics. A support substrate having 1. Si{100}<100>, Euler angles (90°, 90°, 90°); 2. Si{110}<100>, Euler angles (45°, 90°, 90°); or 3. Si{111}<110>, Euler angles (45°, 54.74°, 60°) can provide particularly preferable characteristics.

FIG. 9B shows simulation results of the S-parameter (S11) of four SAW devices with different substrates (the substrates 612, 611, 621, 632 shown in FIG. 8). In general, the S-parameters describe the input-output relationship between ports or terminals in an electrical system. The ports may be defined as any place where voltage and current can be delivered. In practice, S11 may represent the ratio of the amplitude of the signal that reflects from a port to the amplitude of the signal incident on the port. S11 can also be referred to as "gamma, Γ". When S11=0 dB, it indicates that all the power is reflected but no absorption or radiation by the DUT (device under test). When S11 is a negative value, it implies that there are more absorption or radiation than reflection of the power by the DUT.

FIG. 9B indicates that the reflection coefficient curve of the SAW devices with the substrates 612, 611, 621 have sharp peaks distributed around frequency range between 2600 MHz to 3000 MHz (or 2.6 GHz to 3.0 GHz). However, the reflection coefficient curve of the SAW device with the substrate 632 has a relatively wider peak at around 2700 MHz to 2800 MHz (or 2.7 GHz to 2.8 GHz) frequency. This indicates that the use of silicon wafer having cut angle {111}, SAW propagation direction at <110> and Euler angles (45°, 54.74°, 60°) can provide improved reflection coefficient. Combining with the simulation results in FIG. 9A, this also supports that the configuration of Si{111}<110>, Euler angles (45°, 54.74°, 60°) could be ideal within MPS structures for SAW resonators.

As discussed above, the propagation direction of a SAW can be important in obtaining an improved SAW device performance. For example, FIG. 9A indicates that when the propagation direction of the SAW is fixed at <100>, the reflection characteristics may be always good even when the cut angles of silicon wafer are altered. FIG. 10A shows different propagation direction angles used in simulations of FIGS. 10B-10C. FIG. 10B is a graph showing simulated conductance of different SAW devices. FIG. 10C is a graph showing simulated S-parameter (S11) or gamma of the different SAW devices. Each of the SAW devices used in the simulations includes a silicon substrate that has a {100} cut angle. The propagation angles of surface acoustic waves (SAW) in the SAW devices are different. In the simulations, the ten different angles (0°, 5°, 10°, 15°, 20°, 25°, 30°, 35°, 40°, 45°) shown in FIG. 10A from [100] direction to [110] direction are used.

The frequency range for the simulations of FIG. 10B is from 1800 MHz to 2800 MHz (1.8 GHz to 2.8 GHz). A series of spurious signals can be seen from around 2.3 GHz for the propagation angles of 40°, 45°. It is noted that the propagation angle of 45° with respect to the [100] direction is equivalent to the [110] direction, so the result of 45° in FIG. 10B is the same as the result of the SAW device with the substrate 612 (Si {100}<110>) shown in FIG. 9A. A wide range of spurious signals can be found from around 2.4 GHz, 2.5 GHz, and 2.55 GHz for results of 35°, 30°, and 25°, respectively. In contrast, the other results of 0°, 5°, 10°, 15° and 20° show relatively smooth reflection characteristics without many significant noises. Therefore, the results suggest that at a fixed cut angle {100} for silicon wafer, the propagation angles for SAW may be varied from 0° to 20° as from the [100] direction for achieving similarly good reflection characteristics of SAW resonators. More generally, the angle may also range from –20° to 0°. Therefore, any propagation angles between –20° to 20° from the <100> direction may be desirable. The simulation results indicate that the suggested angles also do not cause significant negative effects on the reflection coefficients. Similar simulation may be also done for the configuration of the cut angle {111} and propagation direction of SAW in the <110> direction. A wider range of –0.5° to 0.5° from the <110> direction may be desirable when combined with a cut angle {111}.

Silicon was used as an example material of the support substrates of various embodiments disclosed herein. However, the principles and advantages disclosed herein can be applied to a support substrate that includes different materials. For example, suitable combinations of the cut angles and the wave propagation directions may be determined to apply to a support substrate that includes materials other than silicon.

FIG. 11A is a schematic cross sectional side view of a surface acoustic wave (SAW) device 800a according to an embodiment. The SAW device 800a can include a support substrate 802, a piezoelectric layer 804 over the support substrate 802, an interdigital transducer (IDT) electrode 806 over the piezoelectric layer 804, an adhesion layer 808 between the support substrate 802 and the piezoelectric layer 804, and an intervening layer 810 between the support substrate 802 and the adhesion layer 808. In some embodiments, the adhesion layer can be a silicon oxide layer (e.g., a SiO$_2$ layer). The support substrate 802 can include a crystalline silicon substrate that has a cut angle, in Euler angles, in a range of (90±15°, 90±15°, 90±15°), (45±15°, 90±15°, 90±15°), or (45±15°, 54.74±15°, 60±15°).

The intervening layer 810 can include any suitable dielectric material that has a relatively high acoustic impedance. In some embodiments, the intervening layer 810 can include a polycrystalline or amorphous layer (e.g., a polycrystalline or amorphous silicon layer), a silicon nitride (SiN) layer, or an aluminum nitride (AlN) layer. The intervening layer 810 can suppress parasitic surface conduction that may occur on a surface of the support substrate 802 that faces the adhesion layer 808. In some embodiments, a thickness of the intervening layer 810 can be 0.5 L or less. For example, the thickness of the intervening layer 810 can be in a range of 0.01 L to 0.5 L, 0.1 L to 0.5 L, 0.2 L to 0.5 L, or 0.1 L to 0.3 L. Effects of the intervening layer 810, particularly the polycrystalline silicon layer, are described with reference to FIGS. 12A and 12B. In some embodiments, the intervening layer 810 can have a multilayer structure as shown in FIG. 11B.

FIG. 11B is a schematic cross sectional side view of a surface acoustic wave (SAW) device 800b according to an embodiment. The SAW device 800b is generally similar to the SAW device 800a shown in FIG. 11A, except the SAW device 800b includes a first intervening layer 810a and a second intervening layer 810b in place of the intervening layer 810 of the SAW device 800a. The first intervening layer 810a can be disposed over the support substrate 802, and the second intervening layer 810b can be disposed over the first intervening layer 810a. The first and second intervening layers 810a, 810b can include a polycrystalline or amorphous layer (e.g., a polycrystalline or amorphous silicon layer), a silicon nitride (SiN) layer, or an aluminum nitride (AlN) layer. For example, the first intervening layer 810a can be a polycrystalline or amorphous layer (e.g., a polycrystalline or amorphous silicon layer), and the second intervening layer 810b can be a silicon nitride (SiN) layer or an aluminum nitride (AlN) layer. In some embodiments, a thickness of the first intervening layer 810a can be in a range of 0.01 L to 0.5 L, 0.1 L to 0.5 L, 0.2 L to 0.5 L, or 0.1 L to 0.3 L. In some embodiments, a thickness of the second intervening layer 810b can be in a range of 0.01 L to 0.5 L, 0.1 L to 0.5 L, 0.2 L to 0.5 L, or 0.1 L to 0.3 L.

FIG. 12A shows simulated admittance results of the SAW device 100 (see FIG. 1) for different support substrates. FIG. 12B shows simulated conductance results of the SAW device 100 for the different support substrates. The SAW device 100 used in the simulations of FIGS. 12A and 12B includes a 42° Y-X lithium tantalate layer having a thickness of 0.25 L as the piezoelectric layer (the first substrate layer 102), and a silicon dioxide (SiO$_2$) layer having a thickness of 0.25 L as the adhesive material 103. The different support substrates used as the support substrate 104 in the simulations are silicon substrates with Euler cut angles of (90, 90, 90), (90, 90, 45), (45, 54.74, 90), and (45, 54.74, 60).

FIG. 12C shows simulated admittance results of the SAW device 800a (see FIG. 11A) for different support substrates. FIG. 12D shows simulated conductance results of the SAW device 800a for the different support substrates. The SAW device 800a used in the simulations of FIGS. 12A and 12B includes a 42°Y-X lithium tantalate layer having a thickness of 0.25 L as the piezoelectric layer 804, a silicon dioxide (SiO$_2$) layer having a thickness of 0.25 L as the adhesive layer 808, and a polycrystalline silicon layer having a thickness of 0.25 L as the intervening layer 810. The different support substrates used as the support substrate 802 in the simulations are silicon substrates with Euler cut angles of (90, 90, 90), (90, 90, 45), (45, 54.74, 90), and (45, 54.74, 60).

The simulation results of FIGS. 12A-12D indicate that main acoustic wave excited by the SAW device 800a that includes the intervening layer 810 can be improved. The simulation results of FIGS. 12A-12D indicate that the higher frequency real Y response is dominated by the orientation of silicon of the support substrate 104, 802. The benefits of having the particular cut angles and wave propagation angles disclosed herein can still be realized with the intervening layer 810.

FIGS. 13A-13E are graphs showing simulated conductance results of the SAW device 800a for different thicknesses of the adhesion layer 808 and the piezoelectric layer 804. The SAW device 800a used in the simulations of FIGS. 13A-13E, includes a 42° Y-X lithium tantalate layer as the piezoelectric layer 804, a silicon dioxide (SiO$_2$) layer as the adhesive layer 808, a polycrystalline silicon layer having a thickness of 0.25 L (where L is 4 μm) as the intervening layer 810, and a silicon substrate with a cut angle of (90, 90, 45) in Euler angles as the support substrate 802. FIG. 13A shows the results when the piezoelectric layer 804 has a thickness of 0.1 L. FIG. 13B shows the results when the piezoelectric layer 804 has a thickness of 0.15 L. FIG. 13C shows the results when the piezoelectric layer 804 has a thickness of 0.2 L. FIG. 13D shows the results when the piezoelectric layer 804 has a thickness of 0.25 L. FIG. 13E shows the results when the piezoelectric layer 804 has a thickness of 0.3 L. For each of the piezoelectric layer thicknesses, different Sift layer thicknesses are used in the simulations. The SiO$_2$ layer thicknesses are 0.1 L, 0.15 L, 0.2 L, 0.25 L, and 0.3 L.

FIGS. 14A-14E are graphs showing simulated conductance results of the SAW device 800a for different thicknesses of the adhesion layer 808 and the piezoelectric layer 804. The SAW device 800a used in the simulations of FIGS. 14A-14E, includes a 42° Y-X lithium tantalate layer as the piezoelectric layer 804, a silicon dioxide (SiO$_2$) layer as the adhesive layer 808, a polycrystalline silicon layer having a thickness of 0.25 L (where L is 4 μm) as the intervening layer 810, and a silicon substrate with a cut angle of (90, 90, 90) in Euler angles as the support substrate 802. FIG. 14A shows the results when the piezoelectric layer 804 has a thickness of 0.1 L. FIG. 14B shows the results when the piezoelectric layer 804 has a thickness of 0.15 L. FIG. 14C shows the results when the piezoelectric layer 804 has a thickness of 0.2 L. FIG. 14D shows the results when the piezoelectric layer 804 has a thickness of 0.25 L. FIG. 14E shows the results when the piezoelectric layer 804 has a thickness of 0.3 L. For each of the piezoelectric layer thicknesses, different Sift layer thicknesses are used in the simulations. The SiO$_2$ layer thicknesses are 0.1 L, 0.15 L, 0.2 L, 0.25 L, and 0.3 L.

Figures 15A, 15B, 15C, 15D, 15E:
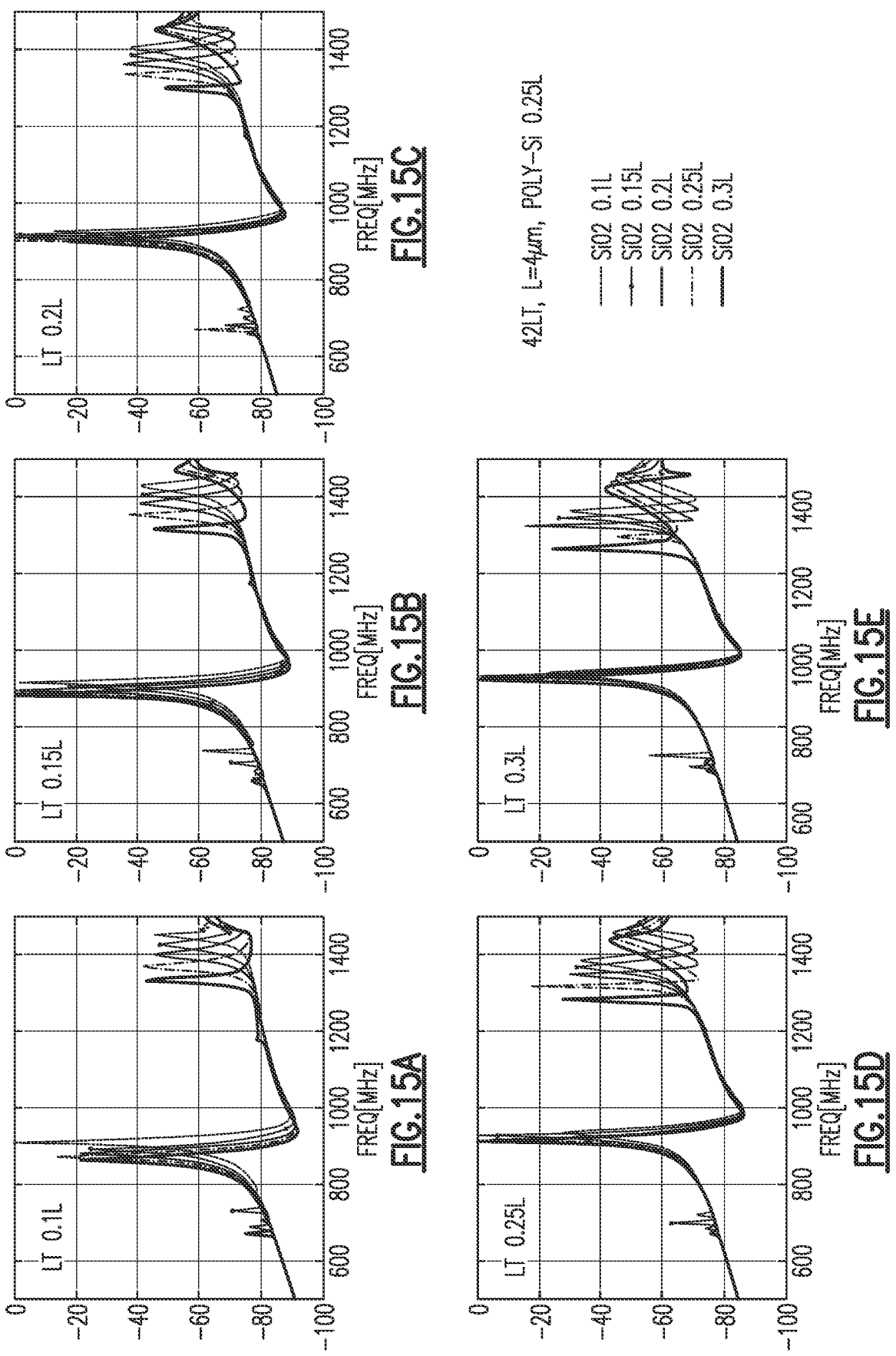
FIGS. 15A-15E are graphs showing simulated conductance results of the SAW device of FIG. 11A having a silicon substrate with a cut angle of (45, 54.74, 60).

FIGS. 15A-15E are graphs showing simulated conductance results of the SAW device 800a for different thicknesses of the adhesion layer 808 and the piezoelectric layer 804. The SAW device 800a used in the simulations of FIGS. 15A-15E, includes a 42°°Y-X lithium tantalate layer as the piezoelectric layer 804, a silicon dioxide (SiO$_2$) layer as the adhesive layer 808, a polycrystalline silicon layer having a thickness of 0.25 L (where L is 4 μm) as the intervening layer 810, and a silicon substrate with a cut angle of (45, 54.74, 60) in Euler angles as the support substrate 802. FIG. 15A shows the results when the piezoelectric layer 804 has a thickness of 0.1 L. FIG. 15B shows the results when the piezoelectric layer 804 has a thickness of 0.15 L. FIG. 15C shows the results when the piezoelectric layer 804 has a thickness of 0.2 L. FIG. 15D shows the results when the piezoelectric layer 804 has a thickness of 0.25 L. FIG. 15E shows the results when the piezoelectric layer 804 has a thickness of 0.3 L. For each of the piezoelectric layer thicknesses, different SiO$_2$ layer thicknesses are used in the simulations. The SiO$_2$ layer thicknesses are 0.1 L, 0.15 L, 0.2 L, 0.25 L, and 0.3 L.

FIGS. 16A-16E are graphs showing simulated conductance results of the SAW device 800a for different thicknesses of the adhesion layer 808 and the piezoelectric layer 804. The SAW device 800a used in the simulations of FIGS. 16A-16E, includes a 42° Y-X lithium tantalate layer as the piezoelectric layer 804, a silicon dioxide (SiO$_2$) layer as the adhesive layer 808, a polycrystalline silicon layer having a thickness of 0.25 L (where L is 4 μm) as the intervening layer 810, and a silicon substrate with a cut angle of (45, 54.74, 90) in Euler angles as the support substrate 802. FIG. 16A shows the results when the piezoelectric layer 804 has a thickness of 0.1 L. FIG. 16B shows the results when the piezoelectric layer 804 has a thickness of 0.15 L. FIG. 16C shows the results when the piezoelectric layer 804 has a thickness of 0.2 L. FIG. 16D shows the results when the piezoelectric layer 804 has a thickness of 0.25 L. FIG. 16E shows the results when the piezoelectric layer 804 has a thickness of 0.3 L. For each of the piezoelectric layer thicknesses, different SiO$_2$ layer thicknesses are used in the simulations. The SiO$_2$ layer thicknesses are 0.1 L, 0.15 L, 0.2 L, 0.25 L, and 0.3 L.

FIG. 13A-16E indicate that when the silicon substrates with cut angles of (90, 90, 90), (45, 54.75, 90), and (45, 54.74, 60) are used as the support substrate 802, the performance of the SAW device 800a can be improved relative to when the silicon substrate with a cut angle of (90, 90, 45) is used as the support substrate 802.

FIG. 17 is a chart showing twenty-five (25) parameter sets of various SAW devices. The SAW devices can have a structure similar to the SAW device 100 of FIG. 1 The first column shows first to twenty-fifth conditions, the second column shows thicknesses of a lithium tantalate layer used as the piezoelectric layer 102, the third column shows thicknesses of a silicon dioxide (SiO$_2$) layer used as the adhesive material 103, the fourth column shows velocities of the SAW device 100 that implements Si(100)<100> as the support substrate 104, the fifth column shows velocities of the SAW device 100 that implement Si(111)<0-10> as the support substrate 104, the sixth column shows velocities of the SAW device 100 that implement Si(100)<110> as the support substrate 104, and the seventh column shows velocities of the SAW device 100 that implement Si(111)<−1-12> as the support substrate 104.

Figure 18:
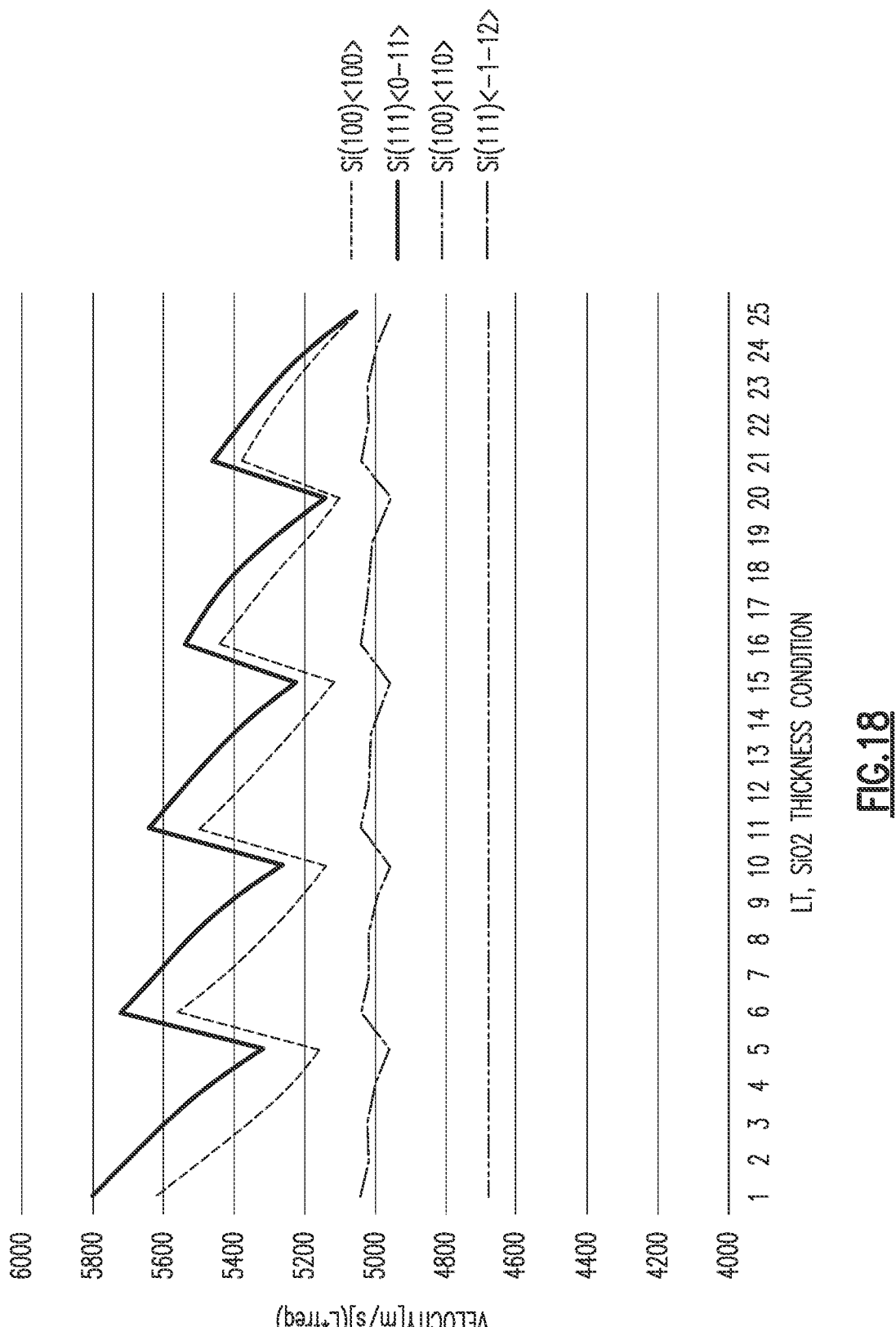
FIG. 18 is a graph showing the frequencies of the different SAW devices shown in FIG. 17.

FIG. 18 is a graph showing the frequencies of the different SAW devices shown in FIG. 17. FIGS. 17 and 18 indicate that for the SAW device 100 with Si(100)<110> as the support substrate 104 has a generally constant velocity limit at about 4680 m/s. FIGS. 17 and 18 indicate that for the SAW device 100 with Si(111)<−1-12> as the support substrate 104 has a velocity limit between about 4960 m/s to 5040 m/s. FIGS. 17 and 18 indicate that for the SAW device 100 with Si(100)<100> as the support substrate 104 has a velocity limit between about 5060 m/s to 5620 m/s. FIGS. 17 and 18 indicate that for the SAW device 100 with Si(111) <0-11> as the support substrate 104 has a velocity limit between about 5060 m/s to 5800 m/s.

Aspects of this disclosure can be implemented in various electronic components or electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

Although embodiments are discussed with reference to surface acoustic wave devices, any suitable principles and advantages discussed herein can be applied to boundary acoustic wave devices, Lamb wave resonators, and/or other suitable acoustic resonators.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 6 GHz.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator comprising:

a plurality of interdigital transducer electrodes; and a multilayer piezoelectric substrate adjacent the plurality of interdigital transducer electrodes, the multilayer piezoelectric substrate including a first substrate layer of a piezoelectric material and a second substrate layer of silicon bonded to the first substrate layer, the silicon having a cut direction and/or acoustic wave propagation direction that is different from those of a silicon substrate, the silicon substrate having a cut direction and a propagation direction property defined by a silicon cut angle of {100} and a propagation direction <110>, the second substrate layer bonded to the first substrate layer using a titanium metal layer as an adhesive layer.

2. The acoustic wave resonator according to claim 1 wherein the propagation direction of acoustic waves in the silicon is <100>.

3. The acoustic wave resonator according to claim 1 wherein the propagation direction of acoustic waves in the silicon is in a range of −20° to 20° from the propagation direction <100>.

4. The acoustic wave resonator according to claim 1 wherein the silicon cut angle is at {111} and the propagation direction of acoustic waves is <110>.

5. The acoustic wave resonator according to claim 1 wherein the silicon cut angle is at {111} with a propagation direction of acoustic waves at a range of −0.5° to 0.5° from a <110> direction.

6. The acoustic wave resonator according to claim 1 wherein the silicon has a cut angle of (100) and a propagation direction of [001]±20 degrees, or the silicon has a cut angle of (110), and a propagation direction of [001]±20 degrees, or the silicon has a cut angle of (111) and a propagation direction of [011]±0.5 degrees.

7. The acoustic wave resonator according to claim 1 wherein the plurality of interdigital transducer electrodes define the propagation direction of the generated acoustic waves.

8. The acoustic wave resonator according to claim 1 wherein the first substrate layer of piezoelectric material is lithium tantalate or lithium niobate.

9. The acoustic wave resonator according to claim 8 wherein the first substrate layer of piezoelectric material is 42° Y-X lithium tantalate.

10. The acoustic wave resonator according to claim 1 wherein the first substrate layer of piezoelectric material has a cut angle in a range of 30° to 50° from a Y direction.

11. The acoustic wave resonator according to claim 1 wherein the multilayer piezoelectric substrate further includes a third substrate layer of silicon dioxide as an adhesive material to bond the first and second layer.

12. The acoustic wave resonator according to claim 11 wherein a thickness of the third substrate layer of adhesive is 0.1 L to 0.5 L, where L is the acoustic wave resonator wavelength.

13. The acoustic wave resonator according to claim 1 wherein the interdigital transducer electrodes includes aluminum (Al) on molybdenum (Mo), tungsten (W), platinum (Pt), or copper (Cu).

14. The acoustic wave resonator according to claim 1 wherein a thickness of the plurality of interdigital transducer electrodes is 0.04 L to 0.2 L where L is the surface acoustic wave resonator wavelength.

15. The acoustic wave resonator according to claim 1 wherein a thickness of the piezoelectric material is 0.1 L to 0.5 L, where L is the surface acoustic wave resonator wavelength.

16. The acoustic wave resonator of claim 1 further comprising a polycrystalline silicon layer, an amorphous silicon layer, a silicon nitride layer or an aluminum nitride layer between the first and second substrate layers.

17. An acoustic wave resonator comprising:
a plurality of interdigital transducer electrodes; and
a multilayer piezoelectric substrate adjacent the plurality of interdigital transducer electrodes, the multilayer piezoelectric substrate including a first substrate layer of a piezoelectric material, and the multilayer piezoelectric substrate further including a second substrate layer of silicon bonded to the first substrate layer which is different from a silicon substrate, having a wafer cut angle and a propagation direction of the acoustic wave defined by a Euler angle of (90, 90, 45), the second substrate layer bonded to the first substrate layer using a titanium metal layer as an adhesive layer.

18. The acoustic wave resonator according to claim 17 wherein the second substrate of silicon is a silicon having a wafer cut angle and a propagation direction of the acoustic wave defined by a Euler angle of (90, 90, 90), (45, 90, 90) or (45, 54.74, 60).

19. The acoustic wave resonator according to claim 17 wherein the third Euler angle defines the propagation direction of the acoustic wave.

20. The acoustic wave resonator according to claim 19 wherein the propagation direction of the acoustic wave is in a range of −20° to 20° from the propagation direction defined by the Euler angle (90, 90, 90), or in a range of −5° to 5° from the propagation direction defined by the Euler angle (45, 54.74, 60).

* * * * *